US012696675B2

(12) United States Patent
Wang et al.

(10) Patent No.: US 12,696,675 B2
(45) Date of Patent: Jul. 28, 2026

(54) QUANTUM DOT FILM, METHOD FOR PATTERNING THE QUANTUM DOT FILM AND APPLICATIONS THEREOF

(71) Applicants: Beijing BOE Technology Development Co., Ltd., Beijing (CN); BOE Technology Group Co., Ltd., Beijing (CN)

(72) Inventors: Haowei Wang, Beijing (CN); Zhuo Li, Beijing (CN); Jingwen Feng, Beijing (CN)

(73) Assignees: BOE Technology Group Co Ltd, Beijing (CN); Beijing BOE Technology Development Co., Ltd., Beijing (CN)

( * ) Notice: Subject to any disclaimer, the term of this patent is extended or adjusted under 35 U.S.C. 154(b) by 790 days.

(21) Appl. No.: 17/919,286

(22) PCT Filed: Nov. 19, 2021

(86) PCT No.: PCT/CN2021/131902
    § 371 (c)(1),
    (2) Date: Oct. 17, 2022

(87) PCT Pub. No.: WO2023/087276
    PCT Pub. Date: May 25, 2023

(65) Prior Publication Data
    US 2024/0298510 A1     Sep. 5, 2024

(51) Int. Cl.
    *H10K 71/12*     (2023.01)
    *C09K 11/06*     (2006.01)
    *H10K 50/115*    (2023.01)
    *H10K 59/35*     (2023.01)

(52) U.S. Cl.
    CPC .............. *H10K 71/12* (2023.02); *C09K 11/06* (2013.01); *H10K 50/115* (2023.02); *H10K 59/35* (2023.02)

(58) Field of Classification Search
    CPC ........ H10K 71/12; H10K 59/35; C09K 11/06; H05B 33/13
    See application file for complete search history.

(56) References Cited

U.S. PATENT DOCUMENTS

| | | |
|---|---|---|
| 2017/0271604 A1 | 9/2017 | Brown et al. |
| 2018/0046080 A1 | 2/2018 | Suzuki et al. |
| 2019/0229279 A1 | 7/2019 | Takizawa et al. |
| 2020/0127219 A1 | 4/2020 | Chen et al. |
| 2020/0295287 A1 | 9/2020 | Yajima et al. |

(Continued)

FOREIGN PATENT DOCUMENTS

| | | |
|---|---|---|
| CN | 106206972 A | 12/2016 |
| CN | 106367060 A | 2/2017 |

(Continued)

*Primary Examiner* — Chad M Dicke
*Assistant Examiner* — Dave Tan

(57)     ABSTRACT

A quantum dot film includes a target color quantum dot film and a residual non-target color quantum dot film, wherein a ligand for the target color quantum dot of the target color quantum dot film is an oil-soluble ligand, and a ligand for the residual non-target color quantum dot of the residual non-target color quantum dot film is selected from any one or more of halogen ions and short-chain organic ligands whose carbon chain length is in a range of 2 to 18 carbons.

20 Claims, 7 Drawing Sheets

(56)                    References Cited

U.S. PATENT DOCUMENTS

| | | | |
|---|---|---|---|
| 2021/0043862 A1* | 2/2021 | Hamilton | H10K 50/115 |
| 2021/0057663 A1 | 2/2021 | Zhang | |
| 2021/0163817 A1* | 6/2021 | Lieberman | C09K 11/62 |
| 2021/0373388 A1* | 12/2021 | Wang | G02F 1/133617 |
| 2022/0340812 A1 | 10/2022 | Nie et al. | |
| 2023/0247848 A1* | 8/2023 | Ryohwa | H10K 59/35 |
| | | | 257/40 |

FOREIGN PATENT DOCUMENTS

| | | | |
|---|---|---|---|
| CN | 106660784 A | 5/2017 | |
| CN | 106753332 A | 5/2017 | |
| CN | 107250912 A | 10/2017 | |
| CN | 109309164 A | 2/2019 | |
| CN | 109378395 A | 2/2019 | |
| CN | 109417079 A | 3/2019 | |
| CN | 109426030 A | 3/2019 | |
| CN | 109935719 A | 6/2019 | |
| CN | 109970887 A | 7/2019 | |
| CN | 109980128 A | 7/2019 | |
| CN | 109994624 A | 7/2019 | |
| CN | 111484849 A | 8/2020 | |
| CN | 111682115 A | 9/2020 | |
| CN | 112011328 A | 12/2020 | |
| CN | 113025308 A | 6/2021 | |
| CN | 113122260 A | 7/2021 | |
| CN | 113206209 A | 8/2021 | |
| WO | 2020228417 A1 | 11/2020 | |

* cited by examiner

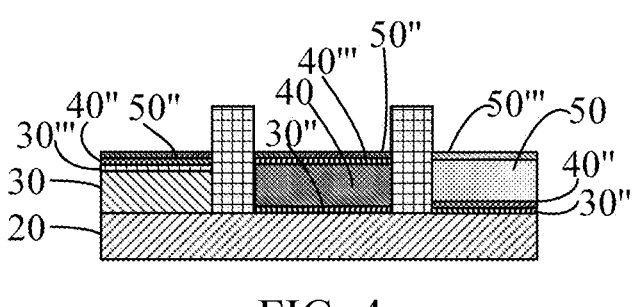
FIG. 4
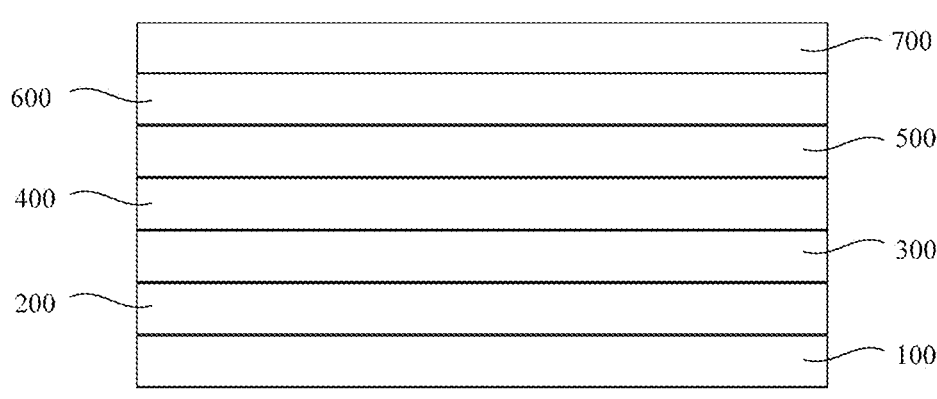
FIG. 5
FIG. 6

QUANTUM DOT FILM, METHOD FOR PATTERNING THE QUANTUM DOT FILM AND APPLICATIONS THEREOF

CROSS-REFERENCE TO RELATED APPLICATION

This application is a national stage application of PCT Application No. PCT/CN2021/131902, which is filed on Nov. 19, 2021 and entitled "Display Substrate and Display Device", the content of which is incorporated herein by reference in its entirety.

TECHNICAL FIELD

Embodiments of the present disclosure relates to, but is not limited to, the display technical field, in particular to a quantum dot film and its application in a quantum dot photoelectric device and a display apparatus, a method for patterning a quantum dot film and its application in manufacturing a quantum dot light-emitting device.

BACKGROUND

Quantum Dot (QD) is an important fluorescent nanometer material. Quantum dots are used as materials of an emitting layer in the fields of flat panel lighting and photoelectric display, which has attracted increasing attention from academia and industry. Up to now, in terms of device performance, the External Quantum Efficiency (EQE) of Quantum dot Light-emitting Diodes (QLED's) has reached more than 20%. At present, a patterning process of quantum dots in light-emitting layer is a critical act to effect full-color, high-resolution QLED devices. At present, transfer printing, inkjet printing and lithography have been used to achieve the patterning of quantum dots.

In practical industrial production, photolithography is usually used to achieve the patterning of electronic materials (quantum dots). Lithography needs the support of a photoresist. The Photoresist includes a positive resist and a negative resist. However, there are some problems in the application of photoresist lithography with a help of the photoresist.

The cost of the negative resist is low, but a developer is usually made of p-xylene, and an organic solvent containing benzene is toxic, which is harm to environmental protection. Positive resist has good contrast ratio, so generated pattern has good display resolution; and a developer is alkaline aqueous solution, which is beneficial to environmental protection. However, the alkaline aqueous solution destroys quantum dots in a light-emitting layer. Specifically, quantum dots can be patterned by "lift-off" process based on the positive resist. Main acts of this process are: "deposition of a positive resist-exposure of a mask in a target region-development-deposition of quantum dots-full exposure-development-introduction of patterned quantum dot layer in the target region". When manufacturing full color (red, green and blue) QLED devices, the above process acts need to be repeated for three times. Wherein, the development of the photoresist mainly depends on alkaline solution (such as ammonia aqueous solution, tetramethyl ammonium hydroxide aqueous solution or the like). Unfortunately, the alkaline solution seriously damages the state of a surface ligand of quantum dots, which is manifested in a fact that hydroxide ions in the alkaline solution destroy the coordination between the surface ligand and a hanging bond of the quantum dots, and then re-expose surface defect sites of the quantum dots, eventually destroying the light-emitting layer and reducing the device efficiency. Therefore, developing more affinity development process or more environmentally friendly patterning process to manufacture high-resolution and full-color QLED has become the focus and difficulty of quantum dot display technology research.

At present, a method for directly patterning a quantum dot light-emitting film layer has been used to manufacture the full-color and high-resolution QLED. However, in a process of using direct patterning to manufacture a quantum dot light-emitting diode in full color, when developing quantum dots, there is always a part of quantum dots that should have been developed remaining in the pixel region, which leads to color blending (for example, red pixels should only emit red light, but contain weak green peak or blue peak), thus affecting a color gamut of the pixel region.

SUMMARY

The following is a summary of subject matters described herein in detail. The summary is not intended to limit the protection scope of claims.

A quantum dot film is provided in an embodiment of the present disclosure, which includes a target color quantum dot film and a residual non-target color quantum dot film, wherein a ligand for the target color quantum dot of the target color quantum dot film is an oil-soluble ligand, and a ligand for the residual non-target color quantum dot of the residual non-target color quantum dot film is selected from any one or more of halogen ions and short-chain organic ligands whose carbon chain length is in a range of 2 to 18 carbons.

A quantum dot photoelectric device is also provided in an embodiment of the present disclosure, which includes the quantum dot film as described above.

A display apparatus is also provided in an embodiment of the present disclosure, which includes a plurality of the quantum dot photoelectric devices as described above.

A method for patterning a quantum dot film is also provided in an embodiment of the disclosure, which includes the following acts S100 to S200.

In S100, quantum dots with oil-soluble ligands are used to form a quantum dot film in whole pixel region, a quantum dot film in a non-retaining pixel region is removed to obtain a patterned quantum dot film.

In S200, precursors for exchange ligands are used to perform a ligand exchange reaction with residual quantum dots in the non-retaining pixel region, so that the oil-soluble ligands on the surface of the residual quantum dots in the non-retaining pixel region is exchanged for the exchange ligand, and a residual quantum dot film in the non-retaining pixel region is obtained.

The exchange ligand is selected from any one or more of halogen ions and short-chain organic ligands whose carbon chain length is in a range of 2 to 18 carbons.

A method for manufacturing a quantum dot light-emitting device is also provided in an embodiment of the present disclosure, which includes: forming a first electrode; using the method for patterning the quantum dot film as described above to form a patterned quantum dot film as a quantum dot light-emitting layer; and forming a second electrode.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate the contents of the present disclosure.

FIG. 4 illustrates a schematic diagram of a structure of a quantum dot layer of a quantum dot photoelectric device according to another exemplary embodiment of the present disclosure.

FIG. 5 is a schematic diagram of a structure of an upright full-color QLED device according to an exemplary embodiment of the present disclosure.

FIG. 6 is a schematic diagram of a structure of an inverted full-color QLED device according to an exemplary embodiment of the present disclosure.

Figure 1:
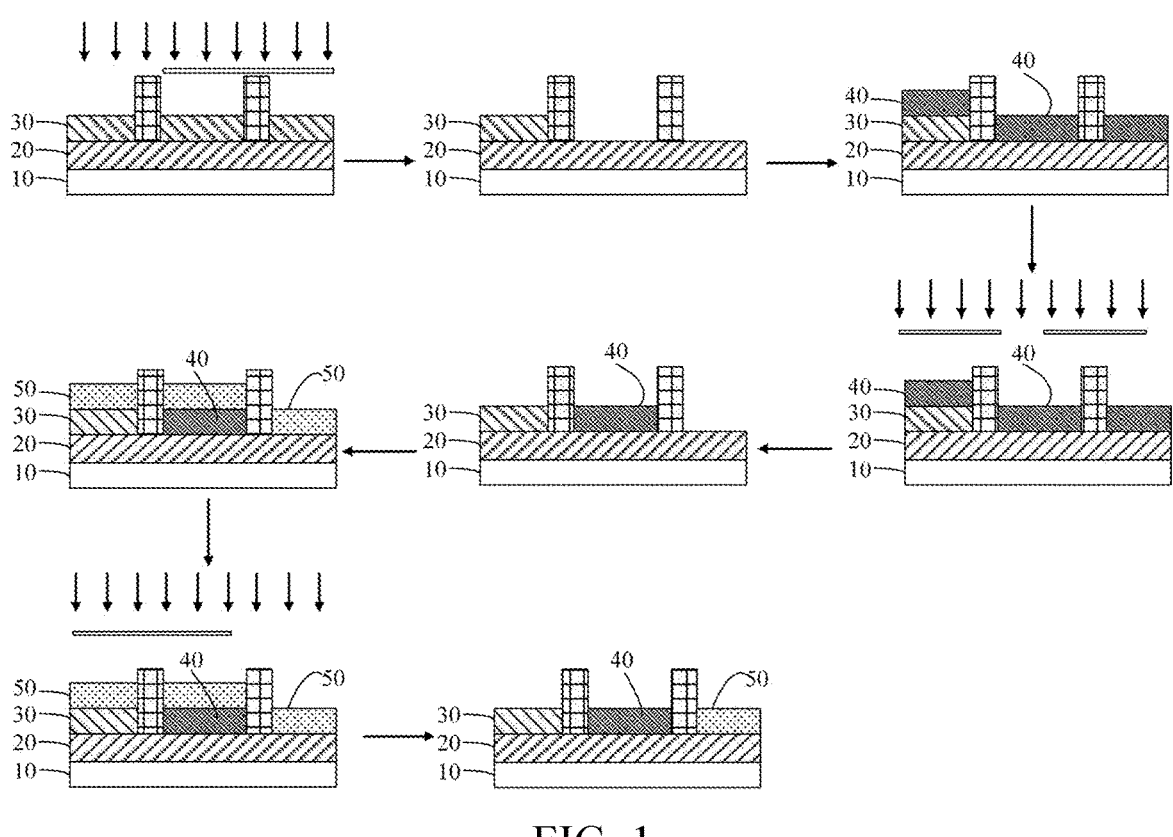
FIG. 1 is a process flow chart for manufacturing quantum dot film patterns by directly patterning ideally.

Meanings of symbols in the accompanying drawings are as follows.

10—substrate; 20—front-side film layer; 30—red quantum dot film; 30'—residual light-emitting red quantum dot film; 30"—residual red quantum dot film; 30'''—functional red quantum dot film; 40—green quantum dot film; 40'—residual light-emitting green quantum dot film; 40"—residual green quantum dot film; 40'''—functional green quantum dot film; 50—blue quantum dot film; 50'—residual light-emitting blue quantum dot film; 50"—residual blue quantum dot film; 50'''—functional blue quantum dot film; 100—anode; 200—hole injection layer; 300—hole transport layer; 400—quantum dot light—emitting layer; 500—electron transport layer; 600—cathode; 700—encapsulation layer; 800—blue light-emitting layer; 2000—blue OLED; 2000'—white OLED; 2000"—blue Micro LED; 3000—red quantum dot conversion layer; 4000—green quantum dot conversion layer; 5000—blue quantum dot conversion layer.

DETAILED DESCRIPTION

Implementations herein may be implemented in multiple different forms. Those of ordinary skills in the art can readily appreciate a fact that the implementations and contents may be varied into various forms without departing from the spirit and scope of the present disclosure. Therefore, the present disclosure should not be explained as being limited to contents described in following implementations only. The embodiments in the present disclosure and features in the embodiments may be combined randomly with each other without conflict.

In the accompanying drawings, a size of a constituent element, and a thickness of a layer or a region is sometimes exaggerated for clarity. Therefore, any one implementation of the present disclosure is not necessarily limited to dimensions shown in the drawings, and the shapes and sizes of the components in the accompanying drawings do not reflect actual scales. In addition, the accompanying drawings schematically show an ideal example, and any one implementation of the present disclosure is not limited to the shapes, values, or the like shown in the accompanying drawings.

In the description of the present disclosure, "film" and "layer" are interchangeable. For example, "quantum dot film" can sometimes be replaced by "quantum dot layer".

In the description of the present disclosure, ordinal numerals such as "first", "second" and "third" are set to avoid confusion of constituents, but not intended for restriction in quantity.

A direct patterning method used at present can achieve the full-color patterning of quantum dot light-emitting diodes, while this process also has its shortcoming, that is, a color blending caused by residual quantum dots in a pixel region.

FIG. 1 is a process flow chart for manufacturing quantum dot film patterns by directly patterning ideally. As shown in FIG. 1, the process for patterning the quantum dot light-emitting diode includes: depositing a front-side film layer 20 on a substrate 10 (i.e., a film layer between the substrate and a quantum dot film; for example, in an inverted QLED, the front-side film layer 20 is an electron transport layer; in an upright QLED, the front-side film layer 20 includes a hole injection layer and a hole transport layer); forming a red quantum dot film 30 on the front-side film layer 20 (for example, by spin coating), exposing the red quantum dot film 30 and cleaning red quantum dot films in a green region and in a blue pixel region to leave only a red quantum dot film 30 in a red pixel region; forming a green quantum dot film 40 (for example, by spin coating), exposing the green quantum dot film 40 and cleaning green quantum dot films in the red pixel region and the blue pixel region to leave only a green quantum dot film in the green pixel region; forming a blue quantum dot film 50 (for example, by spin coating), exposing the blue quantum dot film 50 and cleaning blue quantum dot films in the red pixel region and the green pixel region to leave only a blue quantum dot film in the green pixel region.

The above process is an ideal manufacturing process, but in an actual manufacturing process, there are always residual quantum dots (such as residual red quantum dots in the green pixel region and the blue pixel region, and residual green quantum dots in the red region and the blue pixel region).

Figure 2:
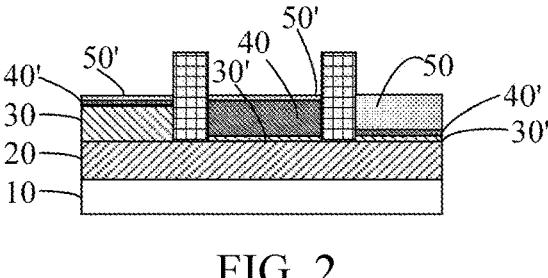
FIG. 2 illustrates a schematic diagram of residual quantum dots.

FIG. 2 illustrates a schematic diagram of residual quantum dots. As shown in FIG. 2, there are a residual light-emitting green quantum dot film 40' formed by residual green quantum dots and a residual light-emitting blue quantum dot film 50' formed by residual blue quantum dots on the red pixel region, there are a residual light-emitting red quantum dot film 30' formed by residual red quantum dots and a residual light-emitting blue quantum dot film 50' formed by residual blue quantum dots on the green pixel region, and there are a residual light-emitting red quantum dot film 30' formed by residual red quantum dots and a residual light-emitting green quantum dot film 40' formed by residual green quantum dots on the blue pixel region.

The existence of residual quantum dots greatly affects the color gamut of full-color quantum dot light-emitting diodes.

For this reason, a quantum dot film is provided in an embodiment of the present disclosure, which includes a target color quantum dot film and a residual non-target color quantum dot film, wherein a ligand for the target color quantum dot of the target color quantum dot film is an oil-soluble ligand, and a ligand for the residual non-target color quantum dot of the residual non-target color quantum dot film is selected from any one or more of halogen ions and short-chain organic ligands whose carbon chain length is in a range of 2 to 18 carbons.

In the description of the embodiment of the present disclosure, the "target color quantum dot film" is defined as a quantum dot film in which a color of emitted light is a desired color in the pixel region;

the "target color quantum dots" are defined as quantum dots forming the "target color quantum dot film";

the "residual non-target color quantum dots" are defined as quantum dots that are different in color from the "target color quantum dots" and should have been removed but remain.

The "residual non-target color quantum dot film" is defined as a quantum dot film formed by the "residual non-target color quantum dots".

For example, the "target color quantum dot film" in the red pixel region is a red quantum dot film, corresponding "target color quantum dots" are red quantum dots, and a green quantum dot film remaining in the red pixel region due to a green quantum dot film formed in the green pixel region and a blue quantum dot film remaining in the red pixel region due to a blue quantum dot film formed in the blue pixel region are residual non-target color quantum dot films for the red pixel region.

Figure 3:
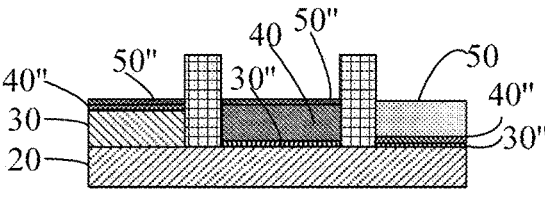
FIG. 3 illustrates a schematic diagram of a structure of a quantum dot layer of a quantum dot photoelectric device according to an exemplary embodiment of the present disclosure.

FIG. 3 illustrates a schematic diagram of a structure of a quantum dot layer of a quantum dot photoelectric device according to an exemplary embodiment of the present disclosure. As shown in FIG. 3, in the exemplary embodiment, the quantum dot layer includes a quantum dot film in a red pixel region, a quantum dot film in a green pixel region and a quantum dot film in a blue pixel region, wherein the quantum dot film in the red pixel region includes a red quantum dot film 30 disposed on a side of the front-side film layer 20, a residual green quantum dot film 40" disposed on a side of the red quantum dot film 30 away from the front-side film layer 20, and a residual blue quantum dot film 50" disposed on a side of the residual green quantum dot film 40" away from the front-side film layer 20; the quantum dot film in the green pixel region includes a residual red quantum dot film 30" disposed on the side of the front-side film layer 20, a green quantum dot film 40 disposed on a side of the residual red quantum dot film 30" away from the front-side film layer 20, and a residual blue quantum dot film 50" disposed on a side of the green quantum dot film 40 away from the front-side film layer 20; the quantum dot film in the blue pixel region includes a residual red quantum dot film 30" disposed on the side of the front-side film layer 20, a residual green quantum dot film 40" disposed on the side of the residual red quantum dot film 30" away from the front-side film layer 20, and a blue quantum dot film 50 disposed on the side of the residual green quantum dot film 40" away from the front-side film layer 20.

In an exemplary embodiment, the quantum dot film may further include a functional quantum dot film disposed on a side of the target color quantum dot film, a quantum dot of the functional quantum dot film is a target color quantum dot, and a ligand for the quantum dot of the functional quantum dot film is selected from any one or more of halogen ions and short-chain organic ligands whose carbon chain length is in a range of 2 to 18 carbons.

FIG. 4 illustrates a schematic diagram of a structure of a quantum dot layer of a quantum dot photoelectric device according to another exemplary embodiment of the present disclosure. As shown in FIG. 4, in the exemplary embodiment, the quantum dot layer includes a quantum dot film in a red pixel region, a quantum dot film in a green pixel region and a quantum dot film in a blue pixel region, wherein the quantum dot film in the red pixel region includes a red quantum dot film 30 disposed on a side of the front-side film layer 20, a red quantum dot film 30''' disposed on a side of the red quantum dot film 30 away from the front-side film layer 20, a residual green quantum dot film 40" disposed on a side of the red quantum dot film 30''' away from the front-side film layer 20, and a residual blue quantum dot film 50" disposed on a side of the residual green quantum dot film 40" away from the front-side film layer 20; the quantum dot film in the green pixel region includes a residual red quantum dot film 30" disposed on the side of the front-side film layer 20, a green quantum dot film 40 disposed on a side of the residual red quantum dot film 30" away from the front-side film layer 20, a functional green quantum dot film 40''' disposed on a side of the green quantum dot film 40 away from the front-side film layer 20, and a residual blue quantum dot film 50" disposed on a side of the functional green quantum dot film 40''' away from the front-side film layer 20; the quantum dot film in the blue pixel region includes a residual red quantum dot film 30" disposed on the side of the front-side film layer 20, a residual green quantum dot film 40" disposed on the side of the residual red quantum dot film 30" away from the front-side film layer 20, a blue quantum dot film 50 disposed on the side of the residual green quantum dot film 40" away from the front-side film layer 20, and a functional blue quantum dot film 50''' disposed on a side of the blue quantum dot film 50 away from the front-side film layer 20. In an exemplary embodiment, the halogen ions may be selected from any one or more of I—, Br—, and Cl—.

In an exemplary embodiment, the carbon chain length of the short-chain organic ligands may be 2, 3, 4, 5, 6, 7, 8, 9, 10, 11, 12, 13, 14, 15, 16, 17, or 18 carbons. In an exemplary embodiment, the short-chain organic ligand may have a carbon chain length of 2 to 8 carbons.

In an exemplary embodiment, the short-chain organic ligand may be selected from any one or more of carboxylic acid, sulfonic acid, phosphonic acid, mercaptan and amine.

In an exemplary embodiment, the carboxylic acid, the sulfonic acid, and the phosphonic acid may be a monobasic acid or a dibasic acid, the mercaptan may be a monobasic alcohol or a dibasic alcohol, and the amine may be a monoamine or a diamine.

In an exemplary embodiment, the carboxylic acid short-chain organic ligand may be selected from any one or more of acetic acid, propionic acid, mercaptopropionic acid, butyric acid, 1, 4-succinic acid, and the like.

In an exemplary embodiment, the sulfonic acid short-chain organic ligand may be selected from any one or more of mesanesulfonic acid, ethanesulfonic acid, propanesulfonic acid and butyl sulfonic acid.

In an exemplary embodiment, the phosphonic acid short-chain organic ligand may be selected from any one or more of methyl phosphonic acid, ethyl phosphonic acid, propyl phosphonic acid and butyl phosphonic acid.

In an exemplary embodiment, the mercaptan short-chain organic ligand may be selected from any one or more of 1, 2-ethylenedimercaptan, ethylmercaptan, 1-propylmercaptan, 1-butyl mercaptan, 1-octyl mercaptan, 1-dodecyl mercaptan, 1-octadecyl mercaptan and 1, 2-benzenedimethyl mercaptan.

In an exemplary embodiment, the amine short-chain organic ligand may be selected from any one or more of ethylenediamine, ethylamine, propylamine and butylamine.

In an exemplary embodiment, each of the target color quantum dots and the residual non-target color quantum dots may be independently selected from any one or more of CdS, CdSe, CdTe, ZnSe, InP, PbS, CuInS$_2$, ZnO, CsPbCl$_3$, CsPbBr$_3$, CsPhI$_3$, CdS/ZnS, CdSe/ZnS, ZnSe, InP/ZnS, Pbs/ZnS, InAs, InGaAs, InGaN, GaNk, ZnTe, Si, Ge, and C.

In an exemplary embodiment, the target color quantum dots and the residual non-target color quantum dots are cadmium-free quantum dots.

In an exemplary embodiment, the oil-soluble ligand may be any one of oleic acid, oleamine, dodecanethiol, trioctylphosphine, trioctylphosphine oxide.

The quantum dot film in the embodiments of the present disclosure includes the target color quantum dot film and the residual non-target color quantum dot film, wherein the target color quantum dot film can emit light with a desired color in the pixel region where the target color quantum dot film is located, the residual non-target color quantum dot films are formed by residual non-target color quantum dots which are different from the desired color in the pixel region where they are located and should be removed but remain. However, the ligands on surfaces of the residual non-target color quantum dots are halogen ions or short-chain organic ligands, so that the residual non-target color quantum dot film does not emit light or an intensity of emitted light is low (the residual non-target color quantum dot film does not emit light in electroluminescent devices and has a low intensity of emitted light in photoluminescent devices). Therefore, although the colors of the residual non-target color quantum dots are undesirable, the color blending caused by the residual non-target color quantum dots can be avoided because the formed residual non-target color quantum dot film does not emit light or the intensity of emitted light is low. When the quantum dot film in the embodiments of the present disclosure is employed as a light-emitting layer of a QLED, the color gamut of a full-color QLED will not be affected. Moreover, the halogen ions and short-chain organic ligands on the surfaces of the residual non-target color quantum dots can modify an interface between the quantum dots and charge transport layers, reducing the quenching of quantum dots and charge transport layers at their interfaces, and further improving the performance of the QLED.

In addition, the quantum dot film in the embodiments of the present disclosure may also include a functional quantum dot film that can be converted from the target color quantum dot film, therefore its quantum dot can be the target color quantum dot, the ligand for the quantum dot of the functional quantum dot film is the halogen ion or the short-chain organic ligand, so that the functional quantum dot film does not emit light or the intensity of emitted light is low, and the functional quantum dot film can exist in the quantum dot film as a functional film, for example, the compatibility of film layers, which are respectively adjacent to the functional quantum dot film on each side, can be improved.

A quantum dot photoelectric device is also provided in an embodiment of the present disclosure, which includes the quantum dot film as described above.

In an exemplary embodiment, the quantum dot photoelectric device may be any one of a quantum dot display device, a photodetector, a photovoltaic device, a light-responsive transistor, and a field-responsive transistor, wherein the quantum dot display device may be any one of a Quantum dot Light-emitting Diode (QLED), a Quantum Dots-Organic Light-emitting Diode (QD-OLED) device, a Quantum Dots-Liquid Crystal Display (QD-LCD) device and a Quantum Dots-Micro Light-emitting Diode (QD-MicroLED) device.

In an exemplary embodiment, the photoelectric device is a quantum dot light-emitting diode that includes an anode, a cathode, and a quantum dot light-emitting layer disposed between the anode and the cathode, and the quantum dot light-emitting layer includes the quantum dot film as described above.

FIG. 5 is a schematic diagram of a structure of an upright full-color QLED device according to an exemplary embodiment of the present disclosure. As shown in FIG. 5, the QLED device in an upright structure may include an anode 100, a hole injection layer 200 disposed on the anode 100, a hole transport layer 300 disposed on a side of the hole injection layer 200 away from the anode 100, a quantum dot light-emitting layer 400 disposed on a side of the hole transport layer 300 away from the anode 100, an electron transport layer 500 disposed on a side of the quantum dot light-emitting layer 400 away from the anode 100, a cathode 600 disposed on a side of the electron transport layer 500 away from the anode 100, and an encapsulation layer 700 disposed on a side of the cathode 600 away from the anode 100, wherein a structure of the quantum dot light-emitting layer 400 is shown in FIG. 3 or FIG. 4.

FIG. 6 is a schematic diagram of a structure of an inverted full-color QLED device according to an exemplary embodiment of the present disclosure. As shown in FIG. 6, the QLED device in an inverted structure may include a cathode 600, an electron transport layer 500 disposed on a cathode 600, a quantum dot light-emitting layer 400 disposed on a side of the electron transport layer 500 away from the cathode 600, a hole transport layer 300 disposed on a side of the quantum dot light-emitting layer 400 away from the cathode 600, a hole injection layer 200 disposed on a side of the hole transport layer 300 away from the cathode 600, an anode 100 disposed on a side of the hole injection layer 200 away from the cathode 600, and an encapsulation layer 700 disposed on a side of the anode 100 away from the cathode 600, wherein a structure of the quantum dot light-emitting layer 400 is shown in FIG. 3 or FIG. 4.

In an exemplary embodiment, the quantum dot photoelectric device is a quantum dots-organic light-emitting diode, wherein the quantum dots-organic light-emitting diode includes an organic light-emitting diode and a quantum dot conversion layer disposed on a side of the blue light organic light-emitting diode away from a substrate, and the quantum dot conversion layer is the quantum dot film as described above.

In an exemplary embodiment, the quantum dot photoelectric device is a quantum dots-blue light organic light-emitting diode, wherein the quantum dots-blue light organic light-emitting diode includes a blue light organic light-emitting diode and a quantum dot conversion layer disposed at a side of the blue light organic light-emitting diode away from the substrate, and the quantum dot conversion layer is a quantum dot film as described above. The blue light organic light-emitting diode includes an anode, a cathode and a blue light-emitting layer between the anode and the cathode. The quantum dot conversion layer includes a red quantum dot conversion layer and a green quantum dot conversion layer, wherein the red quantum dot conversion layer includes a red quantum dot film and a residual green quantum dot film, and the green quantum dot conversion layer includes a green quantum dot film and a residual red quantum dot film.

Figure 7:
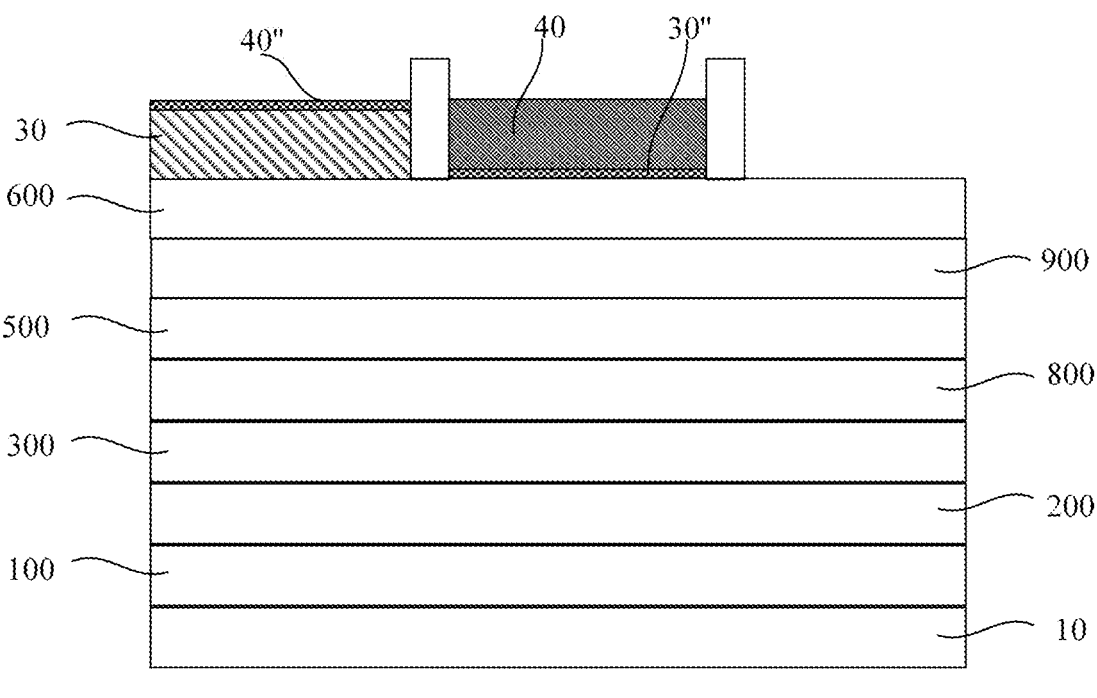
FIG. 7 is a schematic diagram of a structure of a Qd-upright blue OLED device according to an exemplary embodiment of the present disclosure.

FIG. 7 is a schematic diagram of a structure of a QD-upright blue OLED device according to an exemplary embodiment of the present disclosure. As shown in FIG. 7, the QD-upright blue OLED device includes a blue OLED and a quantum dot conversion layer disposed on a side of the OLED away from the substrate 10. The blue OLED includes an anode 100 disposed on the substrate 10, a hole injection layer 200 disposed on a side of the anode 100 away from the substrate 10, a hole transport layer 300 disposed on a side of the hole injection layer 200 away from the substrate 10, a blue light-emitting layer 800 disposed on a side of the hole transport layer 300 away from the substrate 10, an electron transport layer 500 disposed on a side of the blue light-emitting layer 800 away from the substrate 10, an electron injection layer 900 disposed on a side of the electron transport layer 500 away from the substrate 10, and a cathode 600 disposed on a side of the electron injection layer 900 away from the substrate 10.

The quantum dot conversion layer includes a red quantum dot conversion layer and a green quantum dot conversion layer, wherein the red quantum dot conversion layer includes a red quantum dot film 30 disposed on a side of the cathode 600 away from the substrate 10, a residual green quantum dot film 40" disposed on a side of the red quantum dot film 30 away from the substrate 10, the green quantum dot conversion layer includes a residual red quantum dot film 30" disposed on the side of the cathode 600 away from the substrate 10, and a green quantum dot film 40 disposed on a side of the residual red quantum dot film 30" away from the substrate 10.

Figure 8:
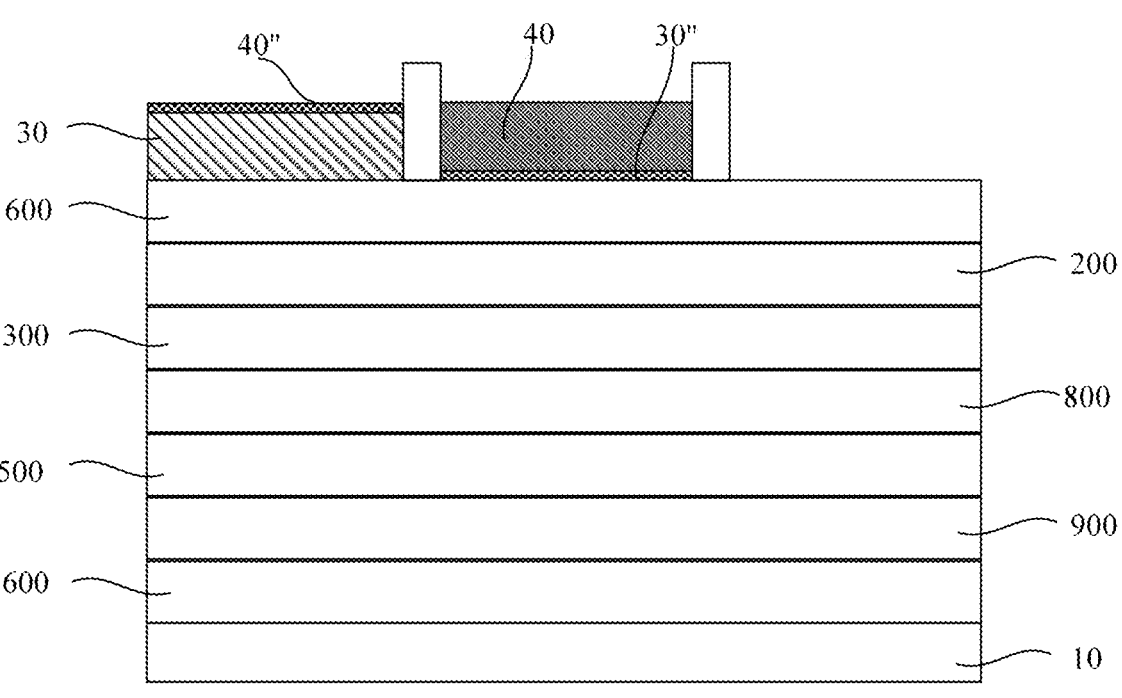
FIG. 8 is a schematic diagram of a structure of a QD-inverted blue OLED device according to an exemplary embodiment of the present disclosure.

FIG. 8 is a schematic diagram of a structure of a QD-inverted blue OLED device according to an exemplary embodiment of the present disclosure. As shown in FIG. 8, the QD-inverted blue OLED device includes a blue OLED and a quantum dot conversion layer disposed on a side of the OLED away from the substrate 10. The blue OLED includes a cathode 600 disposed on the substrate 10, an electron injection layer 900 disposed on a side of the cathode 600 away from the substrate 10, an electron transport layer 500 disposed on a side of the electron injection layer 900 away from the substrate 10, a blue light-emitting layer 800 disposed on a side of the electron transport layer 500 away from the substrate 10, a hole transport layer 300 disposed on a side of the blue light-emitting layer 800 away from the substrate 10, a hole injection layer 200 disposed on a side of the electron transport layer 300 away from the substrate 10, and a cathode 600 disposed on a side of the hole injection layer 200 away from the substrate 10. The quantum dot conversion layer includes a red quantum dot conversion layer and a green quantum dot conversion layer, wherein the red quantum dot conversion layer includes a red quantum dot film 30 disposed on a side of the cathode 600 away from the substrate 10, a residual green quantum dot film 40" disposed on a side of the red quantum dot film 30 away from the substrate 10, the green quantum dot conversion layer includes a residual red quantum dot film 30" disposed on the side of the cathode 600 away from the substrate 10, and a green quantum dot film 40 disposed on a side of the residual red quantum dot film 30" away from the substrate 10.

In an exemplary embodiment, the red quantum dot conversion layer includes a red quantum dot film, a functional red quantum dot film, and a residual green quantum dot film, and the green quantum dot conversion layer includes a green quantum dot film, a functional green quantum dot film, and a residual red quantum dot film.

Figure 9:
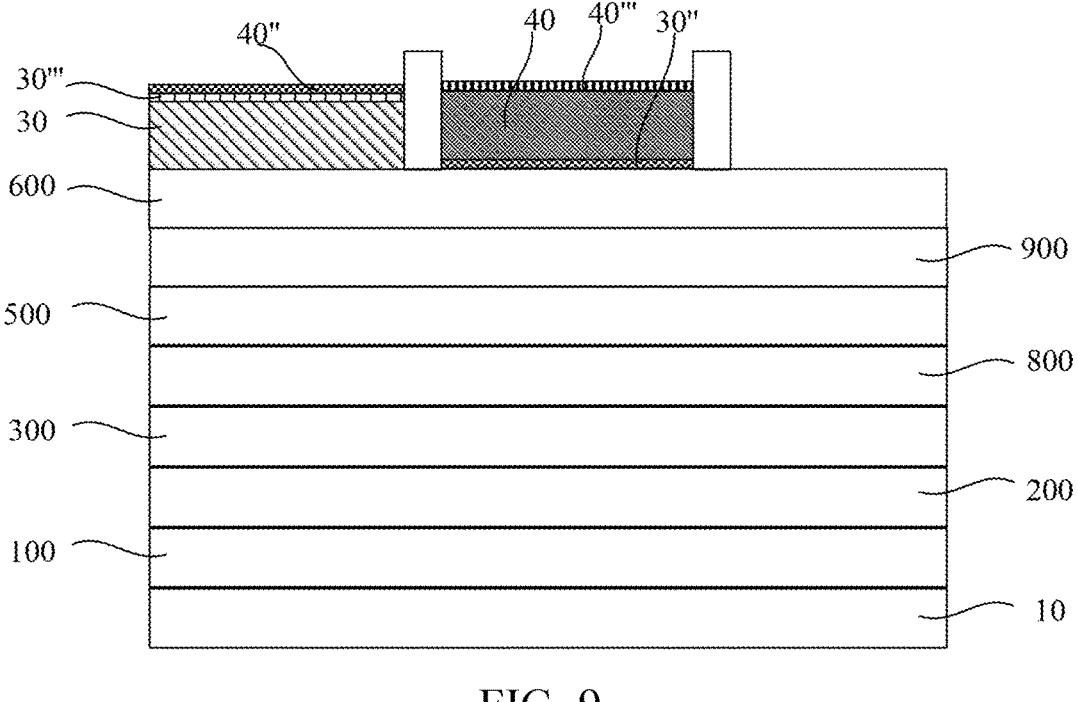
FIG. 9 is a schematic diagram of a structure of a Qd-upright blue OLED device according to another exemplary embodiment of the present disclosure.

FIG. 9 is a schematic diagram of a structure of a Qd-upright blue OLED device according to another exemplary embodiment of the present disclosure. As shown in FIG. 9, the QD-upright blue OLED device includes a blue OLED and a quantum dot conversion layer disposed on a side of the OLED away from the substrate 10. The blue OLED includes an anode 100 disposed on a substrate 10, a hole injection layer 200 disposed on a side of the anode 100 away from the substrate 10, a hole transport layer 300 disposed on a side of the hole injection layer 200 away from the substrate 10, a blue light-emitting layer 800 disposed on a side of the hole injection layer 300 away from the substrate 10, an electron transport layer 500 disposed on a side of the blue light-emitting layer 800 away from the substrate 10, an electron injection layer 900 disposed on a side of the electron transport layer 500 away from the substrate 10, and a cathode 600 disposed on a side of the electron injection layer 900 away from the substrate 10.

The quantum dot conversion layer includes a red quantum dot conversion layer and a green quantum dot conversion layer, wherein the red quantum dot conversion layer includes a red quantum dot film 30 disposed on a side of the cathode 600 away from the substrate 10, a functional red quantum dot film 30''' disposed on a side of the red quantum dot film 30 away from the substrate 10, and a residual green quantum dot film 40" disposed on a side of the functional red quantum dot film 30''' away from the substrate 10, and the green quantum dot conversion layer includes a residual red quantum dot film 30" disposed on the side of the cathode 600 away from the substrate 10, a green quantum dot film 40 disposed on a side of the residual red quantum dot film 30" away from the substrate 10, and a functional green quantum dot film 40''' disposed on a side of the green quantum dot film 40 away from the substrate 10.

A display apparatus is also provided in an embodiment of the present disclosure, which includes a plurality of the quantum dot photoelectric device s as described above.

The display apparatus may be any product or part with a display function, such as a mobile phone, a tablet computer, a television, a display, a laptop computer, a digital photo frame, a navigator, a vehicle-mounted display, a smart watch, and a smart bracelet.

In an exemplary embodiment, the plurality of quantum dot photoelectric devices include quantum dot light-emitting diodes emitting red light, green light and blue light, respectively, and each of the quantum dot light-emitting diodes includes an anode, a cathode, a quantum dot light-emitting layer between the anode and the cathode.

A quantum dot light-emitting layer of the quantum dot light-emitting diode emitting red light includes a target red quantum dot film, a residual green quantum dot film and a residual blue quantum dot film. A ligand for the target red quantum dot of the target red quantum dot film is an oil-soluble ligand, a ligand for the residual green quantum dot of the residual green quantum dot film is a first ligand, and a ligand for the residual blue quantum dot of the residual blue quantum dot film is a second ligand.

A quantum dot light-emitting layer of the quantum dot light-emitting diode emitting green light includes a target green quantum dot film, a residual red quantum dot film and a residual blue quantum dot film. A ligand for the target green quantum dot of the target green quantum dot film is an oil-soluble ligand, a ligand for the residual red quantum dot of the residual red quantum dot film is a third ligand, and a ligand for the residual blue quantum dot of the residual blue quantum dot film is the second ligand.

A quantum dot light-emitting layer of the quantum dot light-emitting diode emitting blue light includes a target blue quantum dot film, a residual red quantum dot film and a residual green quantum dot film. A ligand for the target blue quantum dot of the target blue quantum dot film is an oil-soluble ligand, a ligand for the residual red quantum dot of the residual red quantum dot film is the third ligand, and a ligand for the residual green quantum dot of the residual green quantum dot film is the first ligand.

Each of the first ligand, the second ligand, and the third ligand is independently selected from any one or more of halogen ions and a short-chain organic ligand whose carbon chain length is in a range of 2 to 18 carbons.

In an exemplary embodiment, as shown in FIG. 3, the plurality of quantum dot photoelectric devices include quantum dot light-emitting diodes emitting red light, green light and blue light, respectively, and each of the quantum dot light-emitting diodes includes an anode, a cathode, a quantum dot light-emitting layer between the anode and the cathode.

A quantum dot light-emitting layer of the quantum dot light-emitting diode emitting red light includes a red quantum dot film, a residual green quantum dot film and a residual blue quantum dot film, wherein the target red quantum dot film is disposed on a side of the front-side film layer away from the substrate, the residual green quantum dot film is disposed on a side of the target red quantum dot film away from the substrate, and the residual blue quantum dot film is disposed on a side of the residual green quantum dot film away from the substrate.

A quantum dot light-emitting layer of the quantum dot light-emitting diode emitting green light includes a green quantum dot film, a residual red quantum dot film and a residual blue quantum dot film, wherein the residual red quantum dot film is disposed on the side of the front-side film layer away from the substrate, the target green quantum dot film is disposed on a side of the residual red quantum dot film away from the substrate, and the residual blue quantum dot film is disposed on a side of the target green quantum dot film away from the substrate.

A quantum dot light-emitting layer of a quantum dot light-emitting diode emitting blue light includes a blue quantum dot film, a residual red quantum dot film and a residual green quantum dot film, wherein the residual red quantum dot film is disposed on the side of the front-side film layer away from the substrate, the residual green quantum dot film is disposed on a side of the residual red quantum dot film away from the substrate, and the target blue quantum dot film is disposed on a side of the residual green quantum dot film away from the substrate.

In an exemplary embodiment, as shown in FIG. 4, a quantum dot light-emitting layer of the quantum dot light-emitting diode emitting red light includes a red quantum dot film, a functional red quantum dot film, a residual green quantum dot film and a residual blue quantum dot film, wherein the red quantum dot film is disposed on a side of the front-side film layer away from the substrate, the functional red quantum dot film is disposed on a side of the red quantum dot film away from the substrate, the residual green quantum dot film is disposed on a side of the functional red quantum dot film away from the substrate, and the residual blue quantum dot film is disposed on a side of the residual green quantum dot film away from the substrate;

a quantum dot light-emitting layer of the quantum dot light-emitting diode emitting green light includes a green quantum dot film, a functional green quantum dot film, a residual red quantum dot film and a residual blue quantum dot film, wherein the residual red quantum dot film is disposed on the side of the front-side film layer away from the substrate, the green quantum dot film is disposed on a side of the residual red quantum dot film away from the substrate, the functional green quantum dot film is disposed on a side of the green quantum dot film away from the substrate, and the residual blue quantum dot film is disposed on a side of the functional green quantum dot film away from the substrate;

a quantum dot light-emitting layer of the quantum dot light-emitting diode emitting blue light includes a blue quantum dot film, a functional blue quantum dot film, a residual red quantum dot film and a residual green quantum dot film, wherein the residual red quantum dot film is disposed on the side of the front-side film layer away from the substrate, the residual green quantum dot film is disposed on a side of the residual red quantum dot film away from the substrate, the blue quantum dot film is disposed on a side of the residual green quantum dot film away from the substrate, and the functional blue quantum dot film is disposed on a side of the blue quantum dot film away from the substrate.

In an exemplary embodiment, the first ligand, the second ligand and the third ligand may be the same or different.

In an exemplary embodiment, each of the first ligand, the second ligand and the third ligand may be independently selected from any one or more of I—, Br—, Cl—, carboxylic acid, sulfonic acid, mercaptan, phosphonic acid, and amine.

In an exemplary embodiment, the first ligand may be selected from any one or more of I—, Br— and Cl—, or from any one or more of carboxylic acid, sulfonic acid, mercaptan, phosphonic acid and amine; the second ligand may be selected from any one or more of I—, Br— and Cl—, or from any one or more of carboxylic acid, sulfonic acid, mercaptan, phosphonic acid and amine; and the third ligand may be selected from any one or more of I—, Br— and Cl—, or from any one or more of carboxylic acid, sulfonic acid, mercaptan, phosphonic acid and amine.

In an exemplary embodiment, the third ligand for the residual red quantum dot may include a first halogen ion, a second halogen ion and a third halogen ion, wherein the first halogen ion has a particle size greater than that of the second halogen ion, and the second halogen ion has a particle size greater than that of the third halogen ion.

In an exemplary embodiment, the first halogen ion is I—, the second halogen ion is Br—, and the third halogen ion is Cl—.

A method for patterning a quantum dot film is also provided in an embodiment of the disclosure, which includes the following acts S100 to S200.

In S100, quantum dots with oil-soluble ligands are used to form a quantum dot film in whole pixel region, a quantum dot film in a non-retaining pixel region is removed to obtain a patterned quantum dot film, wherein the patterned quantum dot film can emit light of desired color.

In S200, a precursor for an exchange ligand is used to perform a ligand exchange reaction with residual quantum dots in the non-retaining pixel region, so that the oil-soluble ligand on a surface of the residual quantum dots in the non-retaining pixel region is exchanged for the exchange ligand, and a residual quantum dot film in the non-retaining pixel region is obtained, wherein the residual quantum dot film does not emit light or emits light with an intensity obviously reduced compared with that before ligand exchange.

The exchange ligand is selected from any one or more of halogen ions and short-chain organic ligands whose carbon chain length is in a range of 2 to 18 carbons.

In the method for patterning the quantum dot film according to the embodiment of the present disclosure, the exchange ligand is used to perform the ligand exchange with the residual quantum dots in the non-retaining pixel region (that is, a pixel region in which a quantum dot film in a certain color is not expected to be retained), the oil-soluble ligand on the surface of the residual quantum dots in the non-retaining pixel region is exchanged for the exchange ligand, so that the light-emitting recombination region where the residual quantum dots are in is changed, thereby delocalizing carriers for the residual quantum dots, while oil-soluble ligands on the surface of quantum dots in a retaining pixel region still retain, so that the carriers for the residual quantum dots in the non-retaining pixel region are more easily transferred to the quantum dots in the retaining pixel region, thereby the quantum dots in the non-retaining pixel region do not emit light or emit light with a low intensity, and the color blending caused by the residual quantum dots in the non-retaining pixel region can be avoided. When the method for patterning the quantum dot film according to the embodiment of the present disclosure is used to pattern the light-emitting layer of the QLED, the color gamut of the full-color QLED is not be affected. Moreover, the exchange ligand on the surface of the residual quantum dots in the non-retaining pixel region can modify an interface between the residual quantum dots and charge transport layers, reducing the quenching of quantum dots and charge transport layers at their interfaces, and further improving the performance of the QLED.

Figure 10:
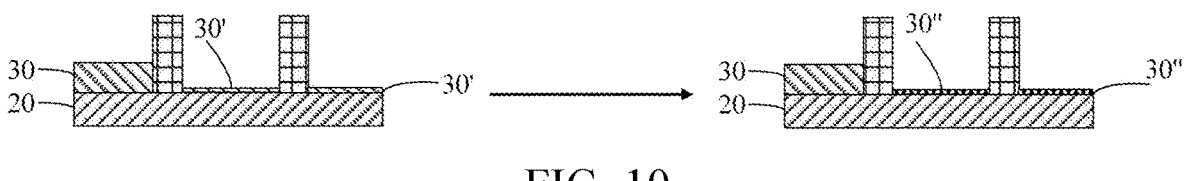
FIG. 10 is a schematic diagram of a ligand in a patterning flow of a single color quantum dot film according to an exemplary embodiment of the present disclosure.
Figure 11:
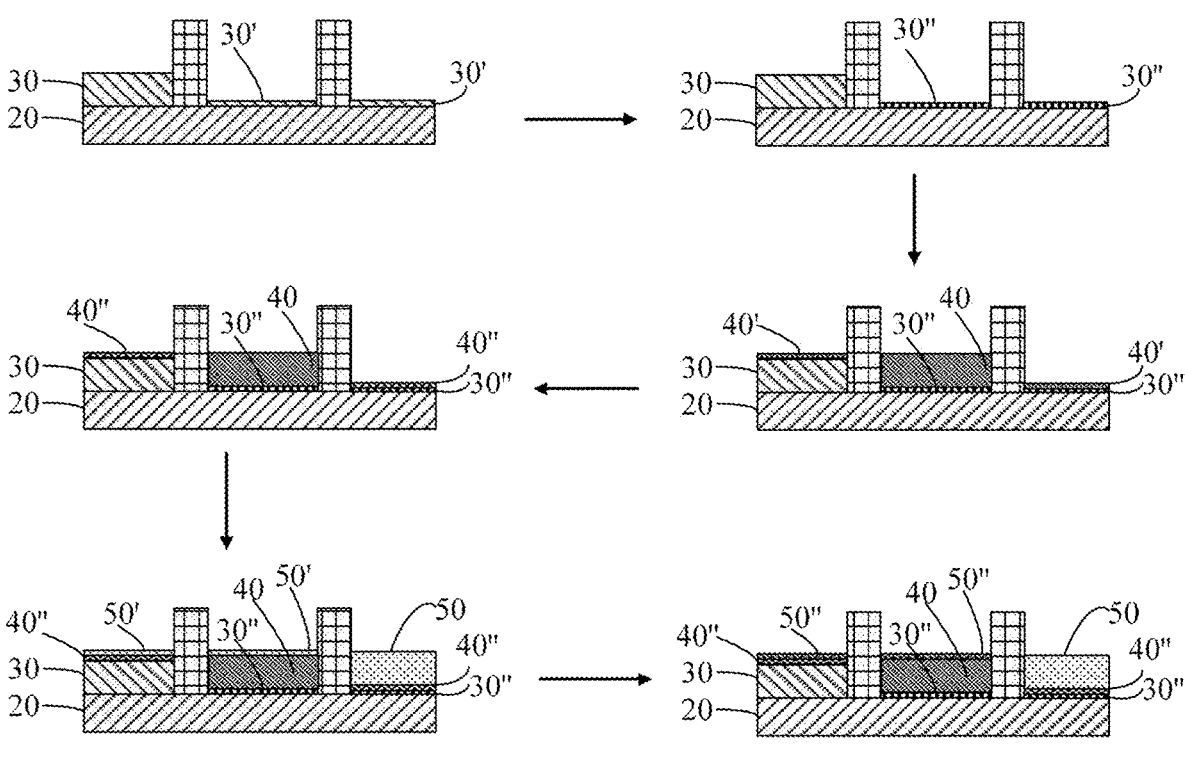
FIG. 11 is a flow chart of patterning of a quantum dot film with a plurality of colors according to an exemplary embodiment of the present disclosure.

FIG. 10 is a schematic diagram of a ligand in a patterning flow of a single color quantum dot film according to an exemplary embodiment of the present disclosure. As shown in FIG. 10, taking a red pixel region as a retaining region as an example, a red quantum dot film 30 capable of emitting red light is disposed on a front-side film layer 20 in the red pixel region. Before ligand exchange, residual light-emitting red quantum dot films 30' in a green pixel region and a blue pixel region (i.e., non-retaining pixel regions) can also emit red light. After the ligand exchange, the residual red quantum dots in the green pixel region and the blue pixel region (i.e., non-retaining pixel regions) are modified by an exchange ligand to obtain a residual red quantum dot film 30" which does not emit light or emits light with a low intensity FIG. 11 is a flow chart of patterning of a quantum dot film with a plurality of colors according to an exemplary embodiment of the present disclosure. As shown in FIG. 11, in an exemplary embodiment, a method for patterning a quantum dot film may include the following acts S101 to S203.

In S101, red quantum dots with oil-soluble ligands are used to form a red quantum dot film 30 on a front-side film layer 20 in whole pixel region, red quantum dot films in a green pixel region and a blue pixel region are removed to obtain a patterned red quantum dot film 30.

In S201, a precursor for a third exchange ligand is used to perform a ligand exchange reaction with residual red quantum dots (which form a residual light-emitting red quantum dot film 30') in the green pixel region and the blue pixel region, so that an oil-soluble ligand on the surface of the residual red quantum dots in the green pixel region and the blue pixel region is exchanged for the third exchange ligand, and a residual red quantum dot films 30" in the green pixel region and the blue pixel region are obtained, wherein the residual red quantum dot film 30" does not emit light or emits light with a significantly lower intensity relative to the residual light-emitting red quantum dot film 30".

In S102, green quantum dots with oil-soluble ligands are used to form a green quantum dot film 40 in the whole pixel region, green quantum dot films in the red pixel region and the blue pixel region are removed to obtain a patterned light-emitting green quantum dot film 40.

In S202, a precursor for a first exchange ligand is used to perform a ligand exchange reaction with residual green quantum dots (which form a residual light-emitting green quantum dot film 40') in the red pixel region and the blue pixel region, so that an oil-soluble ligand on the surface of the residual green quantum dots in the red pixel region and the blue pixel region is exchanged for the first exchange ligand, and residual green quantum dot film 40" in the red pixel region and the blue pixel region are obtained, wherein the residual green quantum dot film 40" does not emit light or emits light with a significantly lower intensity relative to the residual light-emitting green quantum dot film 40".

In S103, green quantum dots with oil-soluble ligands are used to form a blue quantum dot film 50 in the whole pixel region, blue quantum dot films in a red pixel region and a green pixel region are removed to obtain a patterned blue quantum dot film 50.

In S203, a precursor for a second exchange ligand is used to perform a ligand exchange reaction with residual blue quantum dots (which form a residual light-emitting blue quantum dot film 50') in the red pixel region and the green pixel region, so that an oil-soluble ligand on the surface of the residual blue quantum dots in the red pixel region and the green pixel region is exchanged for the second exchange ligand, and a residual blue quantum dot films 50" are obtained in the red pixel region and the green pixel region, wherein the residual blue quantum dot films 50" do not emit light or emits light with a significantly lower intensity relative to the residual light-emitting blue quantum dot film 50".

In the exemplary embodiment, in S201, when the ligand exchange is performed on the residual red quantum dots in the green pixel region and the blue pixel region, a small amount of oil-soluble ligands for the red quantum dots in the red pixel region may also be exchanged for the third exchange ligand to form a functional red quantum dot film. Similarly, in S202, a small amount of oil-soluble ligands for the green quantum dots in the green pixel region are exchanged for the first exchange ligand to form a functional green quantum dot film. In S203, a small amount of oil-soluble ligands for blue quantum dots in the blue pixel region are exchanged for the second exchange ligand to form a functional blue quantum dot film. The functional red quantum dot film, the functional green quantum dot film and the functional blue quantum dot film can exist in the quantum dot films as functional film layers, for example, the compatibility of film layers immediately adjacent to a functional quantum dot film on two sides can be improved. In an exemplary embodiment, the halogen ions may be selected from any one or more of I—, Br—, and Cl—.

In an exemplary embodiment, the short-chain organic ligand may be selected from any one or more of carboxylic acid, sulfonic acid, mercaptan, phosphonic acid and amine.

In an exemplary embodiment, the short-chain organic ligand may have a carbon chain length in a range of 2 to 8 carbons.

In an exemplary embodiment, the carboxylic acid short-chain organic ligand may be selected from any one or more of acetic acid, propionic acid, mercaptopropionic acid, butyric acid and 1, 4-succinic acid.

In an exemplary embodiment, the sulfonic acid short-chain organic ligand may be selected from any one or more of mesanesulfonic acid, ethanesulfonic acid, propanesulfonic acid and butyl sulfonic acid.

In an exemplary embodiment, the mercaptan short-chain organic ligand may be selected from any one or more of 1, 2-ethylenedimercaptan, ethylmercaptan, 1-propylmercaptan, 1-butyl mercaptan, 1-octyl mercaptan, 1-dodecyl mercaptan, 1-octadecyl mercaptan and 1, 2-benzenedimethyl mercaptan.

In an exemplary embodiment, the amine short-chain organic ligand may be selected from any one or more of ethylenediamine, ethylamine, propylamine and butylamine.

In an exemplary embodiment, the first exchange ligand, the second exchange ligand and the third exchange ligand may be the same or different.

In an exemplary embodiment, each of the first exchange ligand, the second exchange ligand and the third exchange ligand may be independently selected from any one or more of I—, Br—, Cl—, carboxylic acid, sulfonic acid, mercaptan, phosphonic acid, and amine.

In an exemplary embodiment, the first exchange ligand may be selected from any one or more of I—, Br— and Cl—, or from any one or more of carboxylic acid, sulfonic acid, mercaptan, phosphonic acid and amine; the second exchange ligand may be selected from any one or more of I—, Br— and Cl—, or from any one or more of carboxylic acid, sulfonic acid, mercaptan, phosphonic acid and amine; and the third exchange ligand may be selected from any one or more of I—, Br— and Cl—, or from any one or more of carboxylic acid, sulfonic acid, mercaptan, phosphonic acid and amine.

In an exemplary embodiment, the act S200 may include using precursors for a variety of exchange ligands to sequentially perform a ligand exchange reaction with residual quantum dots in the non-retaining pixel region, so that the oil-soluble ligands on the surface of the residual quantum dots in the non-retaining pixel region is exchanged for a variety of third exchange ligands, and a residual quantum dot film in the non-retaining pixel region is obtained.

In an exemplary embodiment, the act S200 may include: using an organic salt of a first halogen to perform a ligand exchange reaction with the residual quantum dots in the non-retaining pixel region, so that a first residual quantum dot film with a surface ligand including a first halogen ion is obtained in the non-retaining pixel region; if there is a residual quantum dot with an oil-soluble ligand as the surface ligand in the non-retaining pixel region, using an organic salt of a second halogen in follow to perform a ligand exchange reaction with the residual quantum dots in the non-retaining pixel region, so that a second residual quantum dot film with a surface ligand including the first halogen ion and a second halogen ion is obtained in the non-retaining pixel region; and if there is a residual quantum dot with an oil-soluble ligand as the surface ligand in the non-retaining pixel region, using an organic salt of a third halogen in follow to perform a ligand exchange reaction with the residual quantum dots in the non-retaining pixel region, so that a third residual quantum dot film with a surface ligand including the first halogen ion, the second halogen ion and a third halogen ion is obtained in the non-retaining pixel region.

A particle size of the first halogen ion is larger than that of the second halogen ion, and the particle size of the second halogen ion is larger than that of the third halogen ion.

In an exemplary embodiment, the first halogen ion is I—, the second halogen ion is Br—, and the third halogen ion is Cl—.

In an exemplary embodiment, the act S201 may include: using iodine organic salt to perform a ligand exchange reaction with residual red quantum dots in the green pixel region and the blue pixel region, so that first residual red quantum dot films with a surface ligand including I— are obtained in the green pixel region and the blue pixel region; if there are residual red quantum dots whose surface ligands are oil-soluble ligands in the green pixel region and the blue pixel region, using bromine organic salt in follow to perform ligand exchange reaction with residual red quantum dots in the green pixel region and the blue pixel region, so that a second residual red quantum dot film with surface ligands including I— and Br— are obtained in green pixel region and the blue pixel region; and if there are residual red quantum dots whose surface ligands are oil-soluble ligands in the green pixel region and the blue pixel region, using chlorine organic salt in follow to perform ligand exchange reaction with residual red quantum dots in the green pixel region and the blue pixel region, so that third residual red quantum dot films with surface ligands including I—, Br— and CL- are obtained in green pixel region and the blue pixel region.

In an exemplary embodiment, the act S202 may include: using iodine organic salt in follow to perform ligand exchange reaction with residual green quantum dots in the red pixel region and the blue pixel region, so that first residual red quantum dot films with surface ligands including I— are obtained in red pixel region and the blue pixel region; and if there are residual green quantum dots whose surface ligands are oil-soluble ligands in the red pixel region and the blue pixel region, using bromine organic salt in follow to perform ligand exchange reaction with residual green quantum dots in the red pixel region and the blue pixel region, so that second residual green quantum dot films with surface ligands including I— and Br— are obtained in red pixel region and the blue pixel region.

In an exemplary embodiment, the act S203 may include: using iodine organic salt to perform a ligand exchange reaction with residual blue quantum dots in the red pixel region and the green pixel region, so that first residual blue quantum dot films with a surface ligand including I— are obtained in the red pixel region and the green pixel region.

Because the red quantum dots can absorb light emitted from green quantum dots and blue quantum dots and emit red light, the residual red quantum dots have great influence on the green pixel region and the blue pixel region; Similarly, the residual green quantum dots have great influence on the blue pixel region. Therefore, in the exemplary embodiment, I—, Br—, and Cl— may be used sequentially to perform ligand exchange on the oil-soluble ligands on the surfaces of the residual red quantum dots in the green pixel region and the blue pixel region, so that the oil-soluble ligands on the surfaces of the residual red quantum dots in the green pixel region and the blue pixel region are more fully exchanged; I— and Br— can be used sequentially to exchange the oil-soluble ligands on the surface of the green quantum dots left in the red pixel region and the blue pixel region, so that the oil-soluble ligands on the surface of the residual green quantum dots in the red pixel region and the blue pixel region can be more fully exchanged; I— can be used to exchange the oil-soluble ligands on the surfaces of the residual blue quantum dots in the red pixel region and the green pixel region, so that the oil-soluble ligands on the surfaces of the residual blue quantum dots in the red pixel region and the green pixel region can be more fully exchanged.

In an exemplary embodiment, the ligand exchange reaction in the act S200 may include: dissolving the precursor for the exchange ligand in a solvent to manufacture a solution containing the precursor for the exchange ligand; dropping the solution containing the precursor for the exchange ligand on the residual quantum dot film in the non-retaining pixel region, standing the residual quantum dot film in the non-retaining pixel region for a first time period and then spinning dry; alternatively, soaking the residual quantum dot film in the non-retaining pixel region in the solution containing the exchange ligand precursor, taking the residual quantum dot film in the non-retaining pixel region out after standing for a second time period and spinning dry; cleaning a surface of the spun-dried quantum film in the non-retaining pixel region with the same solvent as the solvent of the mode solution containing the precursor for the exchange ligand.

In an exemplary embodiment, the first halogen is iodine, and the organic salt of the first halogen can be selected from any one or more of tetrabutyl ammonium iodide, tetrabutyl ammonium iodide and tetrapentyl ammonium iodide; the second halogen is bromine, and the organic salt of the second halogen can be selected from any one or more of tetrabutyl ammonium bromide, tetrabutyl ammonium bromide and tetrapentyl ammonium bromide; the third halogen is chlorine, and the organic salt of the third halogen can be selected from any one or more of tetrabutyl ammonium chloride, tetrabutyl ammonium chloride and tetrapentyl ammonium chloride.

In an exemplary embodiment, a concentration of the precursor for the exchange ligand in the solution containing the precursor for the exchange ligand may be from 2 mg/ml to 50 mg/ml, for example, may be 2 mg/ml, 5 mg/ml, 10 mg/ml, 15 mg/ml, 25 mg/ml, 30 mg/ml, 35 mg/ml, 40 mg/ml, 45 mg/ml, 50 mg/ml.

When the exchange ligand is a halogen ion, the concentration of the precursor for the exchange ligand in the solution containing the precursor for the exchange ligand may be from 2 mg/ml to 50 mg/ml; when the exchange ligand is an exchange organic ligand, the concentration of the precursor for the exchange ligand in the solution containing the precursor for the exchange ligand may be from 2 mg/ml to 30 mg/ml.

In an exemplary embodiment, before using the precursor for the first exchange ligand, the precursor for the second exchange ligand and the precursor for the third exchange ligand to perform the ligand exchange reaction, the precursor for the first exchange ligand, the precursor for the second exchange ligand and the precursor for the third exchange ligand are dissolved in a solvent to manufacture a solution containing the precursor for the first exchange ligand, a solution containing the precursor for the second exchange ligand and a solution containing the precursor for the third exchange ligand, respectively.

In the solution containing the precursor for the first exchange ligand, a concentration of the precursor for the first exchange ligand is $C_1$.

In the solution containing the precursor for the second exchange ligand, a concentration of the precursor for the second exchange ligand is $C_2$.

In the solution containing the precursor for the third exchange ligand, a concentration of the precursor for the third exchange ligand is $C_3$.

All of $C_1$, $C_2$ and $C_3$ are in the range of 2 mg/ml to 50 mg/ml, and $C_1$, $C_2$ and $C_3$ may be the same or different.

Because the residual red quantum dots have great influence on the green pixel region and the blue pixel region, and the residual green quantum dots have great influence on the blue pixel region, it is also possible to control the concentrations of the exchange ligands and the time of ligand exchange, so that the oil-soluble ligands on the surfaces of the residual red quantum dots in the green pixel region and the blue pixel region can be more fully exchanged, and the oil-soluble ligands on the surfaces of the residual green quantum dots in the blue pixel region can be more fully exchanged, thereby achieving better results.

In an exemplary embodiment, when the same exchange ligand is used to exchange the residual oil-soluble ligands on the surfaces of red, green and blue quantum dots, a Br— exchange ligand is taken as an example, the methanol solution of tetrabutyl ammonium bromide with a concentration of 30 mg/ml tetrabutyl ammonium bromide can be used to perform a ligand exchange reaction with the oil-soluble ligand on the surface of the residual red quantum dots, and a duration of the ligand exchange reaction can be 50 seconds; a methanol solution of tetrabutyl ammonium bromide with a concentration of 20 mg/ml tetrabutyl ammonium bromide is used for a ligand exchange reaction with oil-soluble ligands on the surface of residual green quantum dots, and a duration of the ligand exchange reaction can be 40 seconds; a methanol solution of tetrabutyl ammonium bromide with a concentration of 10 mg/ml tetrabutyl ammonium bromide is used for a ligand exchange reaction with oil-soluble ligands on the surface of residual blue quantum dots, and a duration of the ligand exchange reaction can be 30 seconds.

In an exemplary embodiment, the solvent may be selected from any one or more of deionized water, acetonitrile, methanol and ethanol.

In an exemplary embodiment, the first time period may be 5 seconds to 60 seconds, for example, 5 seconds, 10 seconds, 20 seconds, 30 seconds, 40 seconds, 50 seconds, 60 seconds; The second time period may be from 10 seconds to 120 seconds, for example, may be 10 seconds, 20 seconds, 30 seconds, 40 seconds, 50 seconds, 60 seconds, 70 seconds, 80 seconds, 90 seconds, 100 seconds, 110 seconds, 120 seconds.

When the exchange ligand is a halogen ion, the first time period can be 5 seconds to 60 seconds; when the exchange ligand is an exchange organic ligand, the first time period may be 10 seconds to 60 seconds.

In an exemplary embodiment, the quantum dot may be independently selected from any one or more of CdS, CdSe, CdTe, ZnSe, InP, PbS, $CuInS_2$, ZnO, $CsPbCl_3$, $CsPbBr_3$, $CsPhI_3$, CdS/ZnS, CdSe/ZnS, ZnSe, InP/ZnS, Pbs/ZnS, InAs, InGaAs, InGaN, GaNk, ZnTe, Si, Ge, and C.

In an exemplary embodiment, the quantum dot is a cadmium-free quantum dot.

In an exemplary embodiment, the oil-soluble ligand may be any one of oleic acid, oleamine, dodecanethiol, trioctylphosphine, trioctylphosphine oxide.

A method for manufacturing a quantum dot light-emitting device is also provided in an embodiment of the present disclosure, which includes: forming a first electrode; using the method for patterning the quantum dot film as described above to form a patterned quantum dot film as a quantum dot light-emitting layer; and forming a second electrode.

In an exemplary embodiment, the quantum dot light-emitting device may be in an upright structure or an inverted structure, wherein the upright structure includes an upright top emitting structure and an upright bottom emission structure, and the inverted structure includes an inverted top emitting structure and an inverted bottom emission structure.

In an exemplary embodiment, the quantum dot light-emitting device is in an upright structure where the first electrode is an anode and the second electrode is a cathode;

After forming the first electrode and before forming a quantum dot light-emitting layer, the manufacturing method further includes: forming a hole injection layer and a hole transport layer on the first electrode sequentially.

The forming the quantum dot light-emitting layer includes forming the quantum dot light-emitting layer on the hole transport layer.

After forming the quantum dot light-emitting layer and before forming a second electrode, the manufacturing method further includes forming an electron transport layer on the quantum dot light-emitting layer.

The forming the second electrode includes forming the second electrode on the electron transport layer.

In an exemplary embodiment, in a QLED device in the upright structure,

An anode 100 may be a bottom emission substrate conductive glass or a common glass substrate on which a conductive layer is deposited, and the conductive layer may be formed of conductive transparent materials such as Indium Tin Oxide (ITO), Indium Zinc Oxide (IZO), F-doped Tin Oxide (FTO), and the like.

An hole injection layer 200 may be manufactured by spin coating, evaporation, inkjet printing or the like; wherein, PEDOT: PSS 4083 (poly (3, 4-ethylene dioxythiophene)/polystyrene sulfonate) or other commercially available compounds suitable for forming hole injection layers can be selected as an organic hole injection layer, such as NiO, MoO3, WoO3, V2O5, CuO, CuS, CuSCN, Cu: NiO, and the like; a film forming temperature of the PEDOT can be 130° C. to 150° C., and a rotating speed of a spin coater can be set to 500 rpm to 2500 rpm to adjust a film thickness.

A hole transport layer 300 may be manufactured by spin coating, evaporation, inkjet printing and the like, and a material of the hole transport layer may be selected from mature commercially available materials such as poly (9, 9-dioctylfluorene-CO—N-(4-butylphenyl) diphenylamine) (TFB), polyvinylcarbazole (PVK), N, N'-bis (3-methylphenyl)-N, N'-diphenyl-1, 1'-biphenyl-4, 4'-diamine (TPD), 4, 4'-bis (9-carbazole) biphenyl (CBP), and the like; when the hole transport layer 300 is formed by spin coating, the rotating speed of the spin coater can be set to 2000 rpm to 4000 rpm, and the film is formed by annealing at 235° C. for 30 minutes.

A target color quantum dot film 400 formed by quantum dots with oil-soluble ligands in the quantum dot light-emitting layer 400 may be manufactured by spin coating, evaporation, inkjet printing and the like, and the used quantum dots may include CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, InAs, InGaAs, InGaN, GaNk, ZnTe, Si, Ge, C and other nano-scale materials (e.g. nanorods and nano-sheets) having the above components.

Taking a target color quantum dot film synthesized by CdSe quantum dots as an example, a specific synthesis method is as follows: in inert gas and at about 100° C., dissolving selenium powder in octadecene to obtain selenium solution; adding CdO and oleic acid into the octadecene and heating to about 280° C. to obtain cadmium precursor solution; adding selenium solution into the cadmium precursor solution, cooling down to about 250° C. for reaction, cooling down to ambient temperature after the reaction, extracting with methanol-hexane to remove unreacted precursor, precipitating with ethanol and dissolving in octane to obtain a CdSe quantum dot solution, and spin coating to form a film (it can also be formed by stamping, printing, EFI printing and the like).

Then, the method for patterning the quantum dot film provided in the embodiments of the present disclosure is used to perform the ligand exchange reaction on the residual quantum dot in the non-retaining pixel region, so that the oil-soluble ligand on the surface of the residual quantum dot in the non-retaining pixel region is exchanged for the exchange ligand, and the residual quantum dot film is obtained in the non-retaining pixel region.

A material of the electron transport layer 500 may be selected from any one or more of alumina, barium fluoride, titanium dioxide, zinc sulfide, zirconia, zinc selenide, magnesium oxide, zinc oxide, yttrium oxide and aluminum fluoride. For example, the electron transport layer 500 may be selected from a zinc oxide nanoparticle film, a zinc oxide sol-gel film or the like.

(a) Manufacturing of the zinc oxide nanoparticle film: for example, a solution obtained by dissolving 90 µl to 120 µl zinc oxide nanoparticles with a concentration of 10 mg/ml to 30 mg/ml in an alcohol solvent (e.g. methanol, ethanol, isopropanol, etc.) is dropped on the quantum dot light-emitting layer for spin coating to form the film at a rotating speed of the spin coater which is set to 500 rpm to 4000 rpm, and form the film at ambient temperature or heating (a temperature can be 25° C. to 250° C., for example, 80° C. to 120° C.) to adjust a thickness of the zinc oxide nanoparticle film, which can be in a range of 20 nm to 100 nm.

(b) Manufacturing of the zinc oxide sol-gel film: 1 g zinc acetate is added to a mixed solvent of 5 ml ethanolamine and n-butanol to manufacture zinc precursor solution; 90 µl to 120 µl zinc precursor solution is dropped on the quantum dot light-emitting layer to spin coating to form a film, the rotating speed of the spin coater is set to 1000 rpm to 4000 rpm, and the solvent is heated and evaporated on a hot table at 180° C. to 300° C. (for example, 250° C. to 300° C.).

The material of the electron transport layer 500 may also be ion-doped zinc oxide nanoparticles such as Mg, In, Al or Ga doped zinc oxide nanoparticles and the like.

The cathode 600 may be manufactured by evaporation or sputtering and may be a metal film (e.g. an aluminum film, a silver film) or an IZO film.

In an exemplary embodiment, the quantum dot light-emitting device is in an inverted structure where the first electrode is a cathode and the second electrode is an anode.

After forming the first electrode and before forming a quantum dot light-emitting layer, the manufacturing method may further include: forming an electron transport layer on the first electrode.

The forming the quantum dot light-emitting layer includes forming the quantum dot light-emitting layer on the electron transport layer.

After forming the quantum dot light-emitting layer and before forming a second electrode, the manufacturing method may further include forming a hole transport layer and a hole injection layer on the quantum dot light-emitting layer sequentially.

The forming the second electrode includes forming the second electrode on the hole injection layer.

In an exemplary embodiment, in a QLED device in the inverted structure, a cathode 600 may be a bottom emission substrate conductive glass or a common glass substrate on which a conductive layer is deposited, and the conductive layer may be formed of conductive transparent materials such as Indium Tin Oxide (ITO), Indium Zinc Oxide (IZO), F-doped Tin Oxide (FTO), and the like.

The anode 100 may be manufactured by evaporation or sputtering and may be a metal film (e.g. an Al film) or an IZO film.

The hole injection layer 200, the hole transport layer 300, the quantum dot light-emitting layer 400, and the electron transport layer 500 can be manufactured by the same material and method as the material and the method of the QLED device in the upright structure.

A method for manufacturing a QLED device in an inverted structure as shown in FIG. 6 is provided in an exemplary embodiment of the present disclosure. In the exemplary embodiment, halogen ions are used for ligand exchange of oil-soluble ligands on a surface of the residual quantum dots, and the manufacturing process may include the following acts.

(1) Manufacturing of a cathode: a conductive glass (formed by depositing ITO or FTO on a glass substrate) is used as the cathode, water and isopropanol are used for ultrasonic cleaning of the conductive glass, and ultraviolet UV treatment is used for 5 minutes to 10 minutes.

(2) Manufacturing of an electron transport layer on the cathode: an electron transport layer is manufactured on the conductive glass cathode, wherein the electron transport layer can be a zinc oxide nanoparticle film or a zinc oxide sol-gel film, etc.

(a) Manufacturing of the zinc oxide nanoparticle film: for example, a solution obtained by dissolving 90 µl to 120 µl zinc oxide nanoparticles with a concentration of 10 mg/ml to 30 mg/ml in an alcohol solvent (e.g. methanol, ethanol, isopropanol, etc.) is dropped on the cathode for spin coating to form the film at a rotating speed of the spin coater which is set to 500 rpm to 4000 rpm, and form the film at ambient temperature or heating (a temperature can be 25° C. to 250° C., for example, 80° C. to 120° C.) to adjust a thickness of the zinc oxide nanoparticle film, which can be in a range of 20 nm to 100 nm. The electron transport layer material can also be selected from ion-doped zinc oxide nanoparticles, such as Mg, In, Al, or Ga-doped magnesium oxide nanoparticles.

(b) Manufacturing of the zinc oxide sol-gel film: 1 g zinc acetate (or zinc nitrate, etc.) is dissolved to a mixed solvent of 5 ml ethanolamine and n-butanol to manufacture zinc precursor solution; the conductive glass in the act (1) is placed on the spin coater, 90 µl to 120 µl zinc precursor solution is dropped on the conductive glass for spin coating to form a film, the rotating speed of the spin coater is set to 1000 rpm to 4000 rpm, the conductive glass is placed on the hot table at 250° C. to 300° C. and the solvent is heated and evaporated.

(3) A patterned red quantum dot film is manufactured on the electron transport layer and modified by halogen atoms.

On the electron transport layer, a red quantum dot film is manufactured by spin coating, evaporation, inkjet printing and the like, and the used quantum dots may include CdS, CdSe, CdTe, ZnSe, InP, PbS, CuInS2, ZnO, CsPbCl3, CsPbBr3, CsPhl3, CdS/ZnS, CdSe/ZnS, ZnSe, InP/ZnS, InAs, InGaAs, InGaN, GaNk, ZnTe, Si, Ge, C and other nano-scale materials (e.g. nanorods and nano-sheets) having the above components.

Taking a red quantum dot film manufactured by CdSe quantum dots as an example, an example of a specific synthesis method is as follows: in inert gas and at about 100° C., dissolving selenium powder in octadecene to obtain selenium solution; adding CdO and oleic acid into the octadecene and heating to about 280° C. to obtain cadmium precursor solution; adding selenium solution into the cadmium precursor solution, cooling down to about 250° C. for reaction, cooling down to ambient temperature after the reaction, extracting with methanol-hexane to remove unreacted precursor, precipitating with ethanol and dissolving in octane to obtain a CdSe quantum dot solution, and spin coating to form a film (it can also be formed by stamping, printing, EFI printing and the like).

Then the quantum dot films in the green region and the blue pixel region are exposed to form a patterned red quantum dot film, but red quantum dots remain in the green pixel region and the blue pixel region, which directly affect the performance of the QLED. Halogen ions can be used to perform ligand exchange of oil-soluble ligands of the residual red quantum dots in the green region and the blue pixel region. A ligand exchange of bromine ion, which is taken as an example, can include: a methanol solution of tetrabutyl ammonium bromide with a concentration of 2 mg/ml to 50 mg/ml is manufactured; after forming a patterned red quantum dot film, the methanol solution of tetrabutyl ammonium bromide is dropped on the red quantum dot film, stood for 5 seconds to 60 seconds and spun-dry, then the surface of the quantum dot film is cleaned with methanol. The above acts are repeated for several times to make the exchange ligand fully exchanged, so as to change its recombination region, so that the residual red quantum dots in the green pixel region and blue pixel region do not emit light, that is, an effect of improving its gamut can be achieved, and the color gamut is as shown in FIG. 3.

(4) A patterned green quantum dot film and a patterned blue quantum dot film are manufactured on the red quantum dot film, and modified by halogen atoms respectively.

A green quantum dot film and a blue quantum dot film are formed by spin coating respectively, and quantum dot films in corresponding regions are exposed to obtain a patterned green quantum dot film and a patterned blue quantum dot films respectively. Then halogen ions are used to perform ligand exchange on oil-soluble ligands of residual green quantum dots in the red pixel region and the blue pixel region, and halogen ions are used to perform ligand exchange on oil-soluble ligands of residual blue quantum dots in the red pixel region and the green pixel region. Taking a ligand exchange of bromine ions as an example, the above process can include: a methanol solution of tetrabutyl ammonium bromide with a concentration of 2 mg/ml to 50 mg/ml is manufactured; after forming the patterned green quantum dot film and the patterned blue quantum dot film, a methanol solution of tetrabutyl ammonium bromide is dropped on the quantum dot film, stood for 5 seconds to 60 seconds and spun-dry, then the surface of the quantum dot film is cleaned with methanol. The above acts are repeated for several times to make the exchange ligand fully exchanged, so as to change its recombination region, so that the residual green quantum dots in the red pixel region and the blue pixel region and the residual blue quantum dots in the red pixel region and the green pixel region do not emit light. The process flow is shown in FIG. 4.

In other embodiments, the exchange ligands used for ligand exchange of oil-soluble ligands on the surfaces of residual red quantum dots, green quantum dots, and blue quantum dots may be the same or different. For example, tetrabutyl ammonium bromide is used for ligand exchange reaction for the residual red quantum dots in the green pixel region and the blue pixel region, tetrabutyl ammonium iodide is used for ligand exchange reaction for the residual green quantum dots in the red pixel region and the blue pixel region, and tetrabutyl ammonium chloride is used for ligand exchange reaction for residual blue quantum dots in the red pixel region and the green pixel region.

(5) A hole transport layer and a hole injection layer are sequentially manufactured on the quantum dot light-emitting layer.

On the quantum dot light-emitting layer, a hole transport layer is manufactured by spin coating, evaporation, inkjet printing, or the like, and a material of the hole transport layer can be selected from mature commercially available materials such as TFB, PVK, TPD, CBP, etc.

Taking the formation of the hole transport layer by spin coating the TFB as an example, the above process can include: 5 mg/ml to 30 mg/ml TFB is dissolved in chlorobenzene solution, spin coated on the quantum dot light-emitting layer at a speed of 2000 rpm to 4000 rpm, and annealed at 235° C. for 30 minutes to form a film.

On the hole transport layer, a hole injection layer is manufactured by spin coating, evaporation, inkjet printing or the like; wherein, PEDOT: PSS 4083 (poly 3, 4-ethylene dioxythiophene/polystyrene sulfonate) or other commercially available compounds suitable for forming hole injection layers can be selected as an organic hole injection layer, such as NiO, MoO3, WoO3, V2O5, CuO, CuS, CuSCN, Cu: NiO, and the like; a film forming temperature of the PEDOT can be 130° C. to 150° C., and a rotating speed of a spin coater can be set to 500 rpm to 2500 rpm to adjust a film thickness.

(6) An anode is manufactured on the hole injection layer: an electrode material is introduced on the hole injection layer to manufacture an anode, for example, the anode is formed by evaporating an aluminum film, a silver film or sputtering an indium zinc oxide (IZO) film.

(7) Encapsulation: an encapsulation cover plate is added, and the device is encapsulated with ultraviolet curing adhesive to obtain a quantum dot light-emitting diode.

A method for manufacturing a QLED device in an upright structure as shown in FIG. 5 is provided in an exemplary embodiment of the present disclosure. In the exemplary embodiment, halogen ions are used for ligand exchange of oil-soluble ligands on a surface of the residual quantum dots, and the manufacturing process may include the following acts.

(1) Manufacturing of an anode: a conductive glass is used as the anode, isopropanol, water and acetone are used to clean the conductive glass, and then the conductive glass is treated under UV for 5 minutes to 10 minutes.

(2) A hole injection layer is manufactured on the anode: on the conductive glass, a hole injection layer is manufactured by spin coating, evaporation, inkjet printing or the like; wherein, PEDOT: PSS 4083 (poly 3, 4-ethylene dioxythiophene/polystyrene sulfonate) or other commercially available compounds suitable for forming hole injection layers can be selected as an organic hole injection layer, such as NiO, MoO3, WoO3, V2O5, CuO, CuS, CuSCN, Cu: NiO, and the like; a film forming temperature of the PEDOT can be 130° C. to 150° C., and a rotating speed of a spin coater can be set to 500 rpm to 2500 rpm to adjust a film thickness.

(3) A hole transport layer is manufactured on the hole injection layer: on the hole injection layer, a hole transport layer is manufactured by spin coating, evaporation, inkjet printing, or the like, and a material of the hole transport layer can be selected from mature commercially available materials such as TFB, PVK, TPD, CBP, etc. Taking the formation of the hole transport layer by spin coating the TFB as an example, the above process can include: 5 mg/ml to 30 mg/ml TFB is dissolved in chlorobenzene solution, spin coated on the quantum dot light-emitting layer at a speed of 2000 rpm to 4000 rpm, and annealed at 235° C. for 30 minutes to form a film.

(4) A patterned red quantum dot film is manufactured on the hole transport layer and modified by halogen atoms:

On the hole transport layer, a red quantum dot film is manufactured by spin coating, evaporation, inkjet printing and the like, and the used quantum dots may include CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, InAs, InGaAs, InGaN, GaNk, ZnTe, Si, Ge, C and other nano-scale materials (e.g. nanorods and nano-sheets) having the above components.

Taking a red quantum dot film manufactured by CdSe quantum dots as an example, an example of a specific synthesis method is as follows: in inert gas and at about 100° C., dissolving selenium powder in octadecene to obtain selenium solution; adding CdO and oleic acid into the octadecene and heating to about 280° C. to obtain cadmium precursor solution; adding selenium solution into the cadmium precursor solution, cooling down to about 250° C. for reaction, cooling down to ambient temperature after the reaction, extracting with methanol-hexane to remove unreacted precursor, precipitating with ethanol and dissolving in octane to obtain a CdSe quantum dot solution, and spin coating to form a film (it can also be formed by stamping, printing, EFI printing and the like).

Then the quantum dot films in the green region and the blue pixel region are exposed to form a patterned red quantum dot film, but red quantum dots remain in the green pixel region and the blue pixel region, which directly affect the performance of the QLED. Halogen ions can be used to perform ligand exchange of oil-soluble ligands of the residual red quantum dots in the green region and the blue pixel region. A ligand exchange of bromine ion, which is taken as an example, can include: a methanol solution of tetrabutyl ammonium bromide with a concentration of 2 mg/ml to 50 mg/ml is manufactured; after forming a patterned red quantum dot film, the methanol solution of tetrabutyl ammonium bromide is dropped on the red quantum dot film, stood for 5 seconds to 60 seconds and spun-dry, then the surface of the quantum dot film is cleaned with methanol. The above acts are repeated for several times to make the exchange ligand fully exchanged, so as to change its recombination region, so that the residual red quantum dots in the green pixel region and blue pixel region do not emit light, that is, an effect of improving its gamut can be achieved, and the color gamut is as shown in FIG. 3.

(5) A patterned green quantum dot film and a patterned blue quantum dot film are manufactured on the red quantum dot film, and modified by halogen atoms respectively.

A green quantum dot film and a blue quantum dot film are formed by spin coating respectively, and quantum dot films in corresponding regions are exposed to obtain a patterned green quantum dot film and a patterned blue quantum dot films respectively. Then halogen ions are used to perform ligand exchange on oil-soluble ligands of residual green quantum dots in the red pixel region and the blue pixel region, and halogen ions are used to perform ligand exchange on oil-soluble ligands of residual blue quantum dots in the red pixel region and the green pixel region. Taking a ligand exchange of bromine ions as an example, the above process can include: a methanol solution of tetrabutyl ammonium bromide with a concentration of 2 mg/ml to 50 mg/ml is manufactured; after forming the patterned green quantum dot film and the patterned blue quantum dot film, a methanol solution of tetrabutyl ammonium bromide is dropped on the quantum dot film, stood for 5 seconds to 60 seconds and spun-dry, then the surface of the quantum dot film is cleaned with methanol. The above acts are repeated for several times to make the exchange ligand fully exchanged, so as to change its recombination region, so that the residual green quantum dots in the red pixel region and the blue pixel region and the residual blue quantum dots in the red pixel region and the green pixel region do not emit light. The process flow is shown in FIG. 4.

In other embodiments, the exchange ligands used for ligand exchange of oil-soluble ligands on the surfaces of residual red quantum dots, green quantum dots, and blue quantum dots may be the same or different. For example, tetrabutyl ammonium bromide is used for ligand exchange reaction for the residual red quantum dots in the green pixel region and the blue pixel region, tetrabutyl ammonium iodide is used for ligand exchange reaction for the residual green quantum dots in the red pixel region and the blue pixel region, and tetrabutyl ammonium chloride is used for ligand exchange reaction for residual blue quantum dots in the red pixel region and the green pixel region.

(6) Manufacturing of an electron transport layer on the quantum dot light-emitting layer: an electron transport layer is manufactured on the quantum dot light-emitting layer, wherein the electron transport layer can be a zinc oxide nanoparticle film or a zinc oxide sol-gel film, etc.

(a) Manufacturing of the zinc oxide nanoparticle film: for example, a solution obtained by dissolving 90 μl to 120 μl zinc oxide nanoparticles with a concentration of 10 mg/ml to 30 mg/ml in an alcohol solvent (e.g. methanol, ethanol, isopropanol, etc.) is dropped on the quantum dot light-emitting layer for spin coating to form the film at a rotating speed of the spin coater which is set to 500 rpm to 4000 rpm, and form the film at ambient temperature or heating (a temperature can be 25° C. to 250° C., for example, 80° C. to 120° C.) to adjust a thickness of the zinc oxide nanoparticle film, which can be in a range of 20 nm to 100 nm. The electron transport layer material can also be selected from ion-doped zinc oxide nanoparticles, such as Mg, In, Al, or Ga-doped magnesium oxide nanoparticles.

(b) Manufacturing of the zinc oxide sol-gel film: 1 g zinc acetate (or zinc nitrate, etc.) is dissolved to a mixed solvent of 5 ml ethanolamine and n-butanol to manufacture zinc precursor solution; the conductive glass in the act (1) is placed on the spin coater, 90 μl to 120 μl zinc precursor solution is dropped on the quantum dot light-emitting layer for spin coating to form a film, the rotating speed of the spin coater is set to 1000 rpm to 4000 rpm, the conductive glass is placed on the hot table at 250° C. to 300° C. and the solvent is heated and evaporated.

(7) A cathode is manufactured on the electron transport layer: an electrode material is introduced on the electron transport layer to manufacture a cathode, for example, the anode is formed by evaporating an aluminum film, a silver film or sputtering an indium zinc oxide (IZO) film.

(8) Encapsulation: an encapsulation cover plate is added, and the device is encapsulated with ultraviolet curing adhesive to obtain a quantum dot light-emitting diode.

A method for manufacturing a QLED device in an inverted structure as shown in FIG. 6 is provided in an exemplary embodiment of the present disclosure. In the exemplary embodiment, a short-chain organic ligand is used for ligand exchange of oil-soluble ligands on a surface of the residual quantum dots, and the manufacturing process may include the following acts.

(1) Manufacturing of a cathode: a conductive glass (formed by depositing ITO or FTO on a glass substrate) is used as the cathode, water and isopropanol are used for ultrasonic cleaning of the conductive glass, and ultraviolet UV treatment is used for 5 minutes to 10 minutes.

(2) Manufacturing of an electron transport layer on the cathode: an electron transport layer is manufactured on the conductive glass cathode, wherein the electron transport layer can be a zinc oxide nanoparticle film or a zinc oxide sol-gel film, etc.

(a) Manufacturing of the zinc oxide nanoparticle film: for example, a solution obtained by dissolving 90 μl to 120 μl zinc oxide nanoparticles with a concentration of 10 mg/ml to 30 mg/ml in an alcohol solvent (e.g. methanol, ethanol, isopropanol, etc.) is dropped on the quantum dot light-emitting layer for spin coating to form the film at a rotating speed of the spin coater which is set to 500 rpm to 4000 rpm, and form the film at ambient temperature or heating (a temperature can be 25° C. to 250° C., for example, 80° C. to 120° C.) to adjust a thickness of the zinc oxide nanoparticle film, which can be in a range of 20 nm to 100 nm. The electron transport layer material can also be selected from ion-doped zinc oxide nanoparticles, such as Mg, In, Al, or Ga-doped magnesium oxide nanoparticles.

(b) Manufacturing of the zinc oxide sol-gel film: 1 g zinc acetate (or zinc nitrate, etc.) is dissolved to a mixed solvent of 5 ml ethanolamine and n-butanol to manufacture zinc precursor solution; the conductive glass in the act (1) is placed on the spin coater, 90 μl to 120 μl zinc precursor solution is dropped on the conductive glass for spin coating to form a film, the rotating speed of the spin coater is set to 1000 rpm to 4000 rpm, the conductive glass is placed on the hot table at 250° C. to 300° C. and the solvent is heated and evaporated.

(3) A patterned red quantum dot film is manufactured on the electron transport layer and modified by the short-chain organic ligand.

On the electron transport layer, a red quantum dot film is manufactured by spin coating, evaporation, inkjet printing and the like, and the used quantum dots may include CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, InAs, InGaAs, InGaN, GaNk, ZnTe, Si, Ge, C and other nano-scale materials (e.g. nanorods and nano-sheets) having the above components.

Taking a red quantum dot film manufactured by CdSe quantum dots as an example, an example of a specific synthesis method is as follows: in inert gas and at about 100° C., dissolving selenium powder in octadecene to obtain selenium solution; adding CdO and oleic acid into the octadecene and heating to about 280° C. to obtain cadmium precursor solution; adding selenium solution into the cadmium precursor solution, cooling down to about 250° C. for reaction, cooling down to ambient temperature after the reaction, extracting with methanol-hexane to remove unreacted precursor, precipitating with ethanol and dissolving in octane to obtain a CdSe quantum dot solution, and spin coating to form a film (it can also be formed by stamping, printing, EFI printing and the like).

Then the quantum dot films in the green region and the blue pixel region are exposed to form a patterned red quantum dot film, but red quantum dots remain in the green pixel region and the blue pixel region, which directly affect the performance of the QLED. A short-chain organic ligand can be used to perform ligand exchange of oil-soluble ligands of the residual red quantum dots in the green region and the blue pixel region. A ligand exchange of ethylene dimercaptan, which is taken as an example, can include: a methanol solution of ethylene dimercaptan with a concentration of 2 mg/ml to 30 mg/ml is manufactured; after forming a patterned red quantum dot film, the methanol solution of ethylene dimercaptan is dropped on the red quantum dot film, stood for 10 seconds to 60 seconds and spun-dry, then the surface of the quantum dot film is cleaned with methanol. The above acts are repeated for several times to make the exchange ligand fully exchanged, so as to change its recombination region, so that the residual red quantum dots in the green pixel region and blue pixel region do not emit light, that is, an effect of improving its gamut can be achieved, and the color gamut is as shown in FIG. 3.

(4) A patterned green quantum dot film and a patterned blue quantum dot film are manufactured on the red quantum dot film, and modified by the short-chain organic ligand, respectively.

A green quantum dot film and a blue quantum dot film are formed by spin coating respectively, and quantum dot films in corresponding regions are exposed to obtain a patterned green quantum dot film and a patterned blue quantum dot films respectively. Then a short-chain organic ligand is used to perform ligand exchange on oil-soluble ligands of residual green quantum dots in the red pixel region and the blue pixel region, and the short-chain organic ligand is used to perform ligand exchange on oil-soluble ligands of residual blue quantum dots in the red pixel region and the green pixel region. Taking a ligand exchange of ethylene dimercaptan as an example, the above process can include: a methanol solution of ethylene dimercaptan with a concentration of 2 mg/ml to 30 mg/ml is manufactured; after forming the patterned green quantum dot film and the patterned blue quantum dot film, a methanol solution of ethylene dimercaptan bromide is dropped on the quantum dot film, stood for 10 seconds to 60 seconds and spun-dry, then the surface of the quantum dot film is cleaned with methanol. The above acts are repeated for several times to make the exchange ligand fully exchanged, so as to change its recombination region, so that the residual green quantum dots in the red pixel region and the blue pixel region and the residual blue quantum dots in the red pixel region and the green pixel region do not emit light. The process flow is shown in FIG. 4. In other embodiments, ethylmercaptan, ethylenediamine, ethylamine and the like may be used as short-chain organic ligands for ligand exchange.

(5) A hole transport layer and a hole injection layer are sequentially manufactured on the quantum dot light-emitting layer.

On the quantum dot light-emitting layer, a hole transport layer is manufactured by spin coating, evaporation, inkjet printing, or the like, and a material of the hole transport layer can be selected from mature commercially available materials such as TFB, PVK, TPD, CBP, etc. Taking the formation of the hole transport layer by spin coating the TFB as an example, the above process can include: 5 mg/ml to 30 mg/ml TFB is dissolved in chlorobenzene solution, spin coated on the quantum dot light-emitting layer at a speed of 2000 rpm to 4000 rpm, and annealed at 235° C. for 30 minutes to form a film.

On the hole transport layer, a hole injection layer is manufactured by spin coating, evaporation, inkjet printing or the like; wherein, PEDOT: PSS 4083 (poly 3, 4-ethylene dioxythiophene/polystyrene sulfonate) or other commercially available compounds suitable for forming hole injection layers can be selected as an organic hole injection layer, such as NiO, MoO3, WoO3, V2O5, CuO, CuS, CuSCN, Cu: NiO, and the like; a film forming temperature of the PEDOT can be 130° C. to 150° C., and a rotating speed of a spin coater can be set to 500 rpm to 2500 rpm to adjust a film thickness.

(6) An anode is manufactured on the hole injection layer: an electrode material is introduced on the hole injection layer to manufacture an anode, for example, the anode is formed by evaporating an aluminum film, a silver film or sputtering an indium zinc oxide (IZO) film.

(7) Encapsulation: an encapsulation cover plate is added, and the device is encapsulated with ultraviolet curing adhesive to obtain a quantum dot light-emitting diode.

A method for manufacturing a QLED device in an upright structure as shown in FIG. 5 is provided in an exemplary embodiment of the present disclosure. In the exemplary embodiment, a short-chain organic ligand is used for ligand exchange of oil-soluble ligands on a surface of the residual quantum dots, and the manufacturing process may include the following acts.

(1) Manufacturing of an anode: a conductive glass is used as the anode, isopropanol, water and acetone are used to clean the conductive glass, and then the conductive glass is treated under UV for 5 minutes to 10 minutes.

(2) A hole injection layer is manufactured on the anode: on the conductive glass, a hole injection layer is manufactured by spin coating, evaporation, inkjet printing or the like; wherein, PEDOT: PSS 4083 (poly 3, 4-ethylene dioxythiophene/polystyrene sulfonate) or other commercially available compounds suitable for forming hole injection layers can be selected as an organic hole injection layer, such as NiO, MoO3, WoO3, V2O5, CuO, CuS, CuSCN, Cu: NiO, and the like; a film forming temperature of the PEDOT can be 130° C. to 150° C., and a rotating speed of a spin coater can be set to 500 rpm to 2500 rpm to adjust a film thickness.

(3) A hole transport layer is manufactured on the hole injection layer: on the hole injection layer, a hole transport layer is manufactured by spin coating, evaporation, inkjet printing, or the like, and a material of the hole transport layer can be selected from mature commercially available materials such as TFB, PVK, TPD, CBP, etc. Taking the formation of the hole transport layer by spin coating the TFB as an example, the above process can include: 5 mg/ml to 30 mg/ml TFB is dissolved in chlorobenzene solution, spin coated on the quantum dot light-emitting layer at a speed of 2000 rpm to 4000 rpm, and annealed at 235° C. for 30 minutes to form a film.

(4) A patterned red quantum dot film is manufactured on the hole transport layer and modified by the short-chain organic ligand.

On the hole transport layer, a red quantum dot film is manufactured by spin coating, evaporation, inkjet printing and the like, and the used quantum dots may include CdS, CdSe, CdTe, ZnSe, InP, PbS, CuInS2, ZnO, CsPbCl3, CsPbBr3, CsPhI3, CdS/ZnS, CdSe/ZnS, ZnSe, InP/ZnS, InAs, InGaAs, InGaN, GaNk, ZnTe, Si, Ge, C and other nano-scale materials (e.g. nanorods and nano-sheets) having the above components.

Taking a red quantum dot film manufactured by CdSe quantum dots as an example, an example of a specific synthesis method is as follows: in inert gas and at about 100° C., dissolving selenium powder in octadecene to obtain selenium solution; adding CdO and oleic acid into the octadecene and heating to about 280° C. to obtain cadmium precursor solution; adding selenium solution into the cadmium precursor solution, cooling down to about 250° C. for reaction, cooling down to ambient temperature after the reaction, extracting with methanol-hexane to remove unreacted precursor, precipitating with ethanol and dissolving in octane to obtain a CdSe quantum dot solution, and spin coating to form a film (it can also be formed by stamping, printing, EFI printing and the like).

Then the quantum dot films in the green region and the blue pixel region are exposed to form a patterned red quantum dot film, but red quantum dots remain in the green pixel region and the blue pixel region, which directly affect the performance of the QLED. A short-chain organic ligand can be used to perform ligand exchange of oil-soluble ligands of the residual red quantum dots in the green region and the blue pixel region. A ligand exchange of ethylene dimercaptan, which is taken as an example, can include: a methanol solution of ethylene dimercaptan with a concentration of 2 mg/ml to 30 mg/ml is manufactured; after forming a patterned red quantum dot film, the methanol solution of ethylene dimercaptan is dropped on the red quantum dot film, stood for 10 seconds to 60 seconds and spun-dry, then the surface of the quantum dot film is cleaned with methanol. The above acts are repeated for several times to make the exchange ligand fully exchanged, so as to change its recombination region, so that the residual red quantum dots in the green pixel region and blue pixel region do not emit light, that is, an effect of improving its gamut can be achieved, and the color gamut is as shown in FIG. 3.

(5) A patterned green quantum dot film and a patterned blue quantum dot film are manufactured on the red quantum dot film, and modified by the short-chain organic ligand, respectively.

A green quantum dot film and a blue quantum dot film are formed by spin coating respectively, and quantum dot films in corresponding regions are exposed to obtain a patterned green quantum dot film and a patterned blue quantum dot films respectively. Then a short-chain organic ligand is used to perform ligand exchange on oil-soluble ligands of residual green quantum dots in the red pixel region and the blue pixel region, and the short-chain organic ligand is used to perform ligand exchange on oil-soluble ligands of residual blue quantum dots in the red pixel region and the green pixel region. Taking a ligand exchange of ethylene dimercaptan as an example, the above process can include: a methanol solution of ethylene dimercaptan with a concentration of 2 mg/ml to 30 mg/ml is manufactured; after forming the patterned green quantum dot film and the patterned blue quantum dot film, a methanol solution of ethylene dimercaptan bromide is dropped on the quantum dot film, stood for 10 seconds to 60 seconds and spun-dry, then the surface of the quantum dot film is cleaned with methanol. The above acts are repeated for several times to make the exchange ligand fully exchanged, so as to change its recombination region, so that the residual green quantum dots in the red pixel region and the blue pixel region and the residual blue quantum dots in the red pixel region and the green pixel region do not emit light. The process flow is shown in FIG. 4. In other embodiments, ethylmercaptan, ethylenediamine, ethylamine and the like may be used as short-chain organic ligands for ligand exchange.

(6) Manufacturing of an electron transport layer on the quantum dot light-emitting layer: an electron transport layer is manufactured on the quantum dot light-emitting layer, wherein the electron transport layer can be a zinc oxide nanoparticle film or a zinc oxide sol-gel film, etc.

(a) Manufacturing of the zinc oxide nanoparticle film: for example, a solution obtained by dissolving 90 μl to 120 μl zinc oxide nanoparticles with a concentration of 10 mg/ml to 30 mg/ml in an alcohol solvent (e.g. methanol, ethanol, isopropanol, etc.) is dropped on the quantum dot light-emitting layer for spin coating to form the film at a rotating speed of the spin coater which is set to 500 rpm to 4000 rpm, and form the film at ambient temperature or heating (a temperature can be 25° C. to 250° C., for example, 80° C. to 120° C.) to adjust a thickness of the zinc oxide nanoparticle film, which can be in a range of 20 nm to 100 nm. The electron transport layer material can also be selected from ion-doped zinc oxide nanoparticles, such as Mg, In, Al, or Ga-doped magnesium oxide nanoparticles.

(b) Manufacturing of the zinc oxide sol-gel film: 1 g zinc acetate (or zinc nitrate, etc.) is dissolved to a mixed solvent of 5 ml ethanolamine and n-butanol to manufacture zinc precursor solution; the conductive glass in the act (1) is placed on the spin coater, 90 μl to 120 μl zinc precursor solution is dropped on the quantum dot light-emitting layer for spin coating to form a film, the rotating speed of the spin coater is set to 1000 rpm to 4000 rpm, the conductive glass is placed on the hot table at 250° C. to 300° C. and the solvent is heated and evaporated.

(7) A cathode is manufactured on the electron transport layer: an electrode material is introduced on the electron transport layer to manufacture a cathode, for example, the anode is formed by evaporating an aluminum film, a silver film or sputtering an indium zinc oxide (IZO) film.

(8) Encapsulation: an encapsulation cover plate is added, and the device is encapsulated with ultraviolet curing adhesive to obtain a quantum dot light-emitting diode.

In the manufacturing process of Quantum Dots-Organic Light-emitting diode (QD-OLED) devices, a ligand exchange method can also be used to solve the color blending caused by residual quantum dot.

A method for manufacturing a Quantum Dots-Blue light Organic Light-emitting Diode (QD-Blue OLED) device is provided in an exemplary embodiment of the present disclosure.

Figure 12:
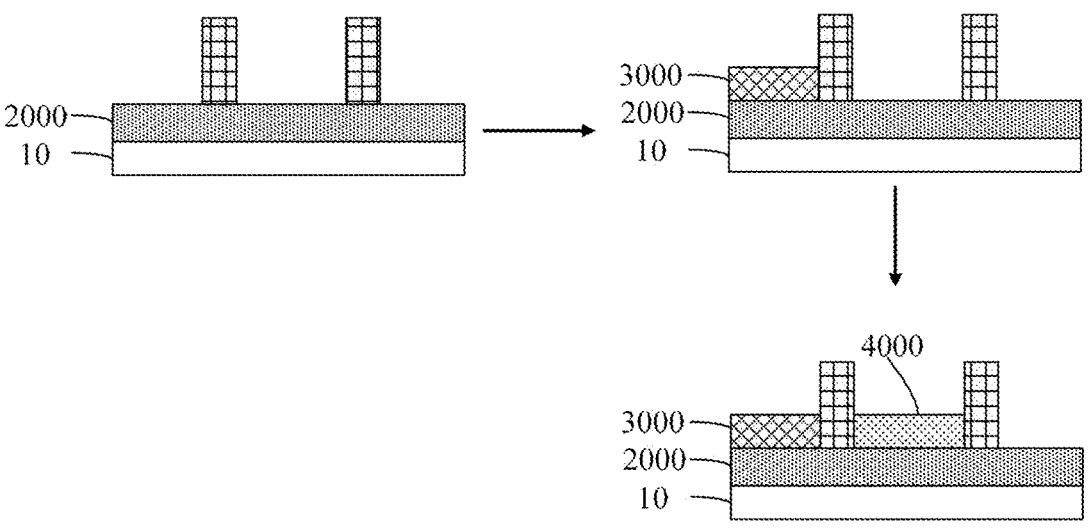
FIG. 12 is a flow chart of manufacturing of a QD-blue OLED full-color device.

Because blue OLED emits blue light by itself, only patterned red quantum dot conversion layer and patterned green quantum dot conversion layer need to be manufactured when manufacturing a quantum dot conversion layer. FIG. 12 is a flow chart of manufacturing of a QD-Blue OLED full-color device. As shown in FIG. 12, the manufacturing method includes the following acts.

(1) A blue OLED 2000 is manufactured on a substrate 10.

(2) A red quantum dot conversion layer 3000 is manufactured on the blue OLED 2000, and the red quantum dot conversion layer 3000 is patterned to obtain a patterned red quantum dot conversion layer 3000. For residual red quantum dots in the non-retaining pixel region, a halogen ion or a short-chain organic ligand can be used to perform ligand exchange on oil-soluble ligands on the surface of the residual red quantum dots in the non-retaining pixel region with reference to the method for manufacturing the QLED device as described in the exemplary embodiments of the present disclosure above.

(3) A green quantum dot conversion layer 4000 is manufactured, and the green quantum dot conversion layer 4000 is patterned to obtain a patterned green quantum dot conversion layer 4000, and a halogen ion or a short-chain organic ligand can be used to perform ligand exchange on oil-soluble ligands on the surface of the residual green quantum dots in the non-retaining pixel region.

A method for manufacturing a Quantum Dots-White Organic Light-emitting Diode (QD-White OLED) device is provided in an exemplary embodiment of the present disclosure.

Figure 13:
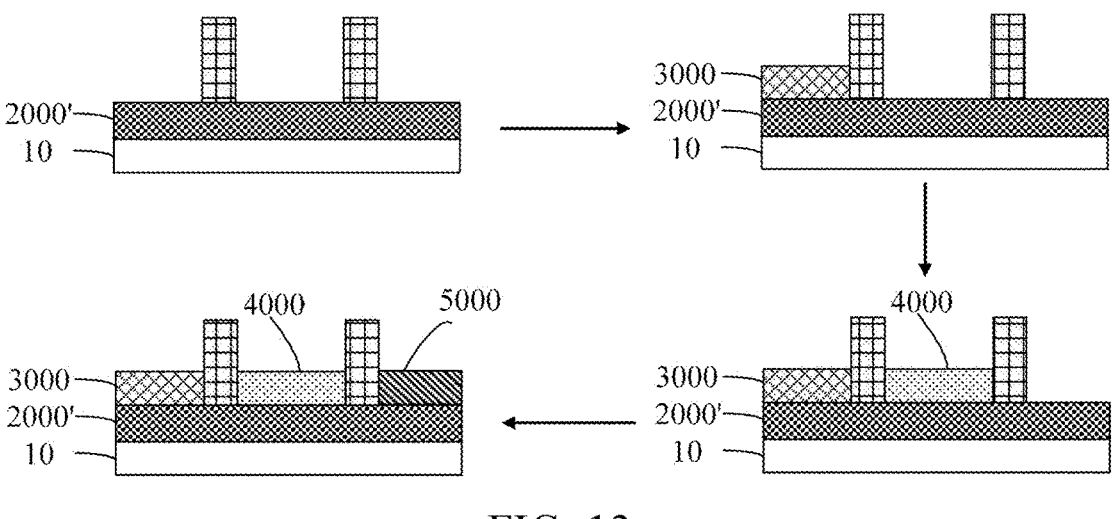
FIG. 13 is a flow chart of manufacturing of a QD-White OLED full-color device.

FIG. 13 is a flow chart of manufacturing of a QD-White OLED full-color device. As shown in FIG. 13, the manufacturing method includes the following acts.

(1) A white OLED 2000' is manufactured on a substrate 10.

(2) A red quantum dot conversion layer 3000 is manufactured on the white OLED 2000', and the red quantum dot conversion layer 3000 is patterned to obtain a patterned red quantum dot conversion layer 3000. For residual red quantum dots in the non-retaining pixel region, a halogen ion or a short-chain organic ligand can be used to perform ligand exchange on oil-soluble ligands on the surface of the residual red quantum dots in the non-retaining pixel region with reference to the method for manufacturing the QLED device as described in the exemplary embodiments of the present disclosure above.

(3) A green quantum dot conversion layer 4000 is manufactured, and the green quantum dot conversion layer 4000 is patterned to obtain a patterned green quantum dot conversion layer 4000, and a halogen ion or a short-chain organic ligand can be used to perform ligand exchange on oil-soluble ligands on the surface of the residual green quantum dots in the non-retaining pixel region.

(4) A blue quantum dot conversion layer 5000 is manufactured, and the blue quantum dot conversion layer 5000 is patterned to obtain a patterned blue quantum dot conversion layer 5000, and a halogen ion or a short-chain organic ligand can be used to perform ligand exchange on oil-soluble ligands on the surface of the residual blue quantum dots in the non-retaining pixel region.

In the manufacturing process of Quantum Dots-Micro Light-emitting diode (QD-Micro LED) devices, a ligand exchange method can also be used to solve the color blending caused by residual quantum dot.

Figure 14:
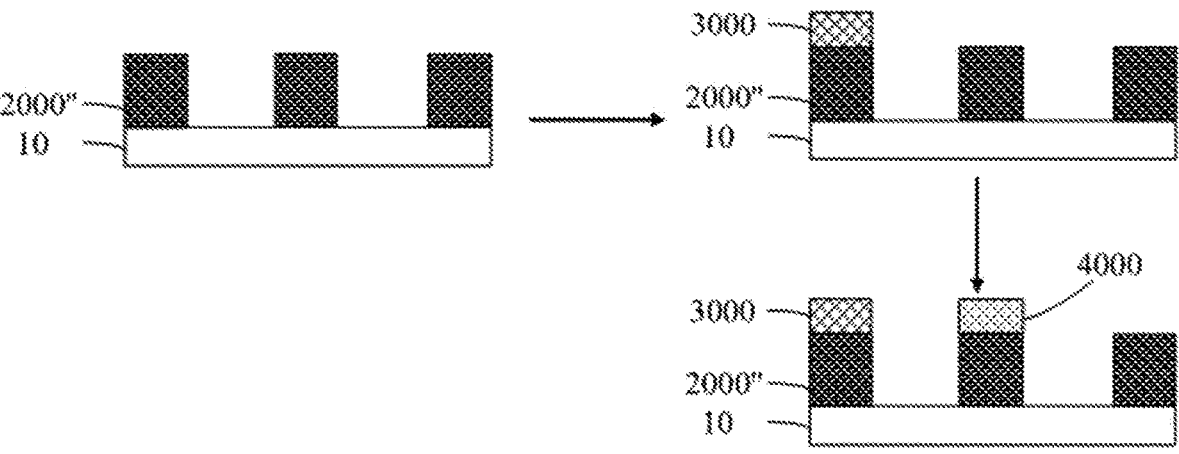
FIG. 14 is a flow chart of manufacturing of a QD-blue Micro LED full-color device.

A method for manufacturing a Quantum Dots-Blue Micro Light-emitting Diode (QD-Blue Micro LED) is provided in an exemplary embodiment of the present disclosure. Because Blue Micro LED emits blue light by itself, only patterned red quantum dot conversion layer and patterned green quantum dot conversion layer need to be manufactured when manufacturing a quantum dot conversion layer. FIG. 14 is a flow chart of manufacturing of a QD-blue Micro LED full-color device. As shown in FIG. 14, the manufacturing method includes the following acts.

(1) A blue Micro LED 2000" is manufactured on a substrate 10.

(2) A red quantum dot conversion layer 3000 is manufactured on the blue micro LED 2000", and the red quantum dot conversion layer 3000 is patterned to obtain a patterned red quantum dot conversion layer 3000. For residual red quantum dots in the non-retaining pixel region, a halogen ion or a short-chain organic ligand can be used to perform ligand exchange on oil-soluble ligands on the surface of the residual red quantum dots in the non-retaining pixel region with reference to the method for manufacturing the QLED device as described in the exemplary embodiments of the present disclosure above.

(3) A green quantum dot conversion layer 4000 is manufactured, and the green quantum dot conversion layer 4000 is patterned to obtain a patterned green quantum dot conversion layer 4000, and a halogen ion or a short-chain organic ligand can be used to perform ligand exchange on oil-soluble ligands on the surface of the residual green quantum dots in the non-retaining pixel region.

An effect of the ligand exchange of the oil-soluble ligands on the surface of residual quantum dots using the exchange ligand in the embodiment of the present disclosure is explained below by experiments.

A manufacturing process of a PL substrate may include the following acts.

(1) Manufacturing of a cathode: a conductive glass deposited with an ITO is used as cathode, and the conductive glass is cleaned by water and isopropanol respectively, and then the conductive glass is treated under UV for 10 minutes.

(2) Manufacturing of an electron transport layer on the cathode: an electron transport layer is manufactured on the conductive glass cathode, wherein the electron transport layer is a zinc oxide nanoparticle film.

Manufacturing of a zinc oxide nanoparticle film: 100 μl ethanol solution of ZnO nanoparticles with a concentration of 20 mg/ml is dropped to the cathode, a speed of a spin coater is set to 2500 rpm and the spin coater operates, and a film is formed under heating and baking at 200° C. for 15 minutes to form an electron transport layer with a thickness of 45 nm.

(3) A red quantum dot film is manufactured on the electron transport layer.

A red quantum dot film is manufactured by CdSe quantum dots: in inert gas and at about 100° C., selenium powder is dissolved in octadecene to obtain selenium solution; CdO and oleic acid are added into the octadecene and heated to about 280° C. to obtain cadmium precursor solution; selenium solution is added into the cadmium precursor solution, cooled down to about 250° C. for reaction, cooled down to ambient temperature after the reaction, extracted with methanol-hexane to remove unreacted precursor, precipitated with ethanol and dissolved in octane to obtain a CdSe quantum dot solution, and spin coated to form a film.

(4) A methanol solution of tetrabutyl ammonium iodide with a concentration of 10 mg/ml is dropped on the red quantum dot film, stood for 60 seconds and spun-dry, then the surface of the red quantum dot film is cleaned with methanol, the methanol solution of tetrabutyl ammonium iodide with the concentration of 10 mg/ml is dropped on the surface of the red quantum dot film again, stood for 60 seconds and spun-dry. The above acts are repeated for 2 to 10 times to make the ligand exchange complete.

The light emission performance of the PL substrate before and after the ligand exchange is tested. The test results are shown in FIG. 15.

Figure 15:
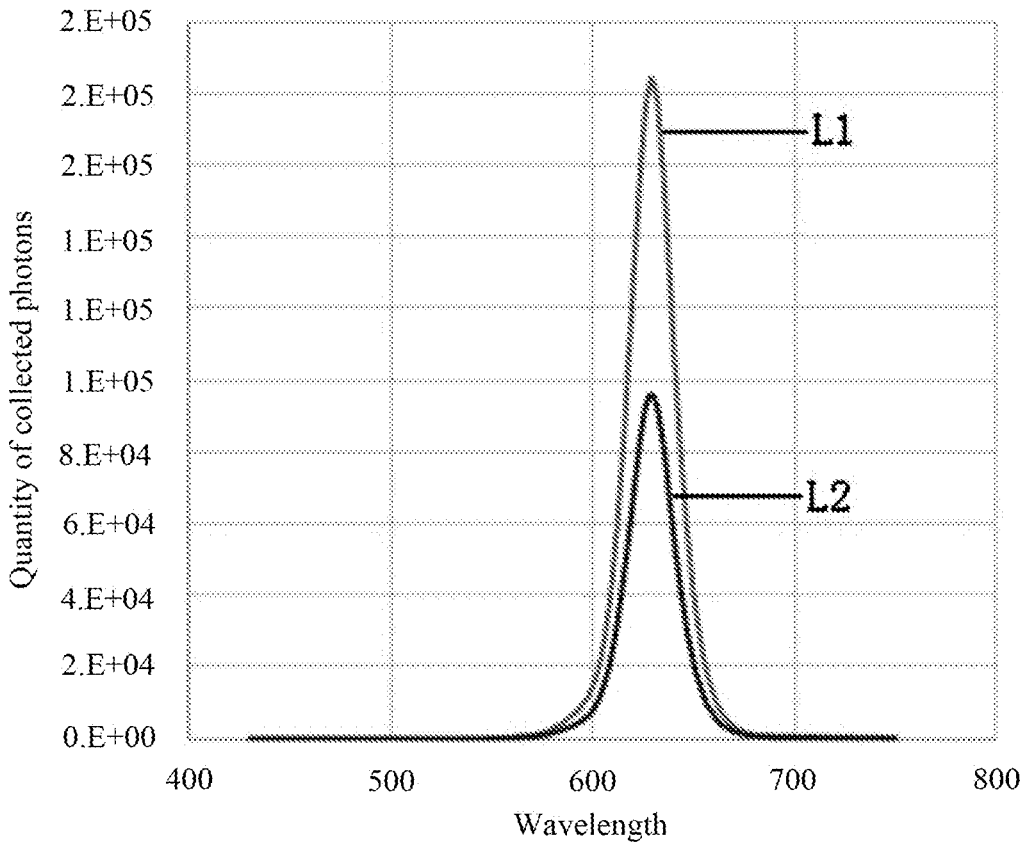
FIG. 15 is a graph showing a comparison of photoluminescence states of a PL substrate before and after performing quantum dot ligand exchange according to an exemplary embodiment of the present disclosure.

FIG. 15 is a graph showing a comparison of photoluminescence states of a PL substrate before and after performing quantum dot ligand exchange according to an exemplary embodiment of the present disclosure. Where L1 represents a curve of a quantity of photons collected before quantum dot ligand exchange as a function of a wavelength, and L2 represents a curve of a quantity of photons collected after quantum dot ligand exchange as a function of the wavelength.

It can be seen that the intensity of red light emitted by the PL substrate is reduced obviously after the quantum dot ligand exchange.

Although the embodiments disclosed in the present disclosure are as above, the described contents are only embodiments used for convenience of understanding the present disclosure and are not intended to limit the present disclosure. Any person skilled in the art of the present disclosure may make any modification and change in forms and details of implementation without departing from the spirit and scope disclosed in the present disclosure. However, the scope of patent protection of the present disclosure is still subject to the scope defined in the appended claims.

The invention claimed is:

1. A quantum dot film, comprising a target color quantum dot film and a residual non-target color quantum dot film, wherein a ligand for a target color quantum dot of the target color quantum dot film is an oil-soluble ligand;

a ligand for a residual non-target color quantum dot of the residual non-target color quantum dot film is selected from any one or more of halogen ions and short-chain organic ligands whose carbon chain length is in a range of 2 to 18 carbons;

the residual non-target color quantum dot is different in color from the target color quantum dot;

the residual non-target color quantum dot film does not emit light.

2. The quantum dot film of claim 1, wherein the halogen ion is selected from any one or more of I—, Br—, and Cl—.

3. The quantum dot film of claim 1, wherein a short-chain organic ligand of the short-chain organic ligands is selected from any one or more of carboxylic acid, sulfonic acid, mercaptan, phosphonic acid and amine.

4. The quantum dot film of claim 3, wherein the short-chain organic ligand has a carbon chain length in a range of 2 to 8 carbons.

5. The quantum dot film of claim 4, wherein the carboxylic acid is selected from any one or more of acetic acid, propionic acid, mercaptopropionic acid, butyric acid and 1, 4-succinic acid;

the sulfonic acid is selected from any one or more of mesanesulfonic acid, ethanesulfonic acid, propanesulfonic acid and butyl sulfonic acid;

the mercaptan is selected from any one or more of 1, 2-ethylenedimercaptan, ethylmercaptan, 1-propylmercaptan, 1-butyl mercaptan, 1-octyl mercaptan 1-dodecyl mercaptan, 1-octadecyl mercaptan and 1, 2-benzenedimethyl mercaptan; and the amine is selected from any one or more of ethylenediamine, ethylamine, propylamine and butylamine.

6. The quantum dot film of claim 1, wherein the quantum dot film further comprises a functional quantum dot film disposed on a side of the target color quantum dot film, a quantum dot of the functional quantum dot film is a target color quantum dot, and a ligand for the quantum dot of the functional quantum dot film is selected from any one or more of halogen ions and short-chain organic ligands whose carbon chain length is in a range of 2 to 18 carbons.

7. A quantum dot photoelectric device, comprising the quantum dot film of claim 1.

8. The quantum dot photoelectric device of claim 7, wherein the quantum dot photoelectric device is a quantum dot light-emitting diode that comprises an anode, a cathode, and a quantum dot light-emitting layer disposed between the anode and the cathode, and the quantum dot light-emitting layer comprises the quantum dot film.

9. The quantum dot photoelectric device of claim 7, wherein the quantum dot photoelectric device is a quantum dots-blue light organic light-emitting diode, wherein the quantum dots-blue light organic light-emitting diode comprises a blue light organic light-emitting diode and a quantum dot conversion layer disposed at a side of the blue light organic light-emitting diode, and the quantum dot conversion layer is the quantum dot film;

the blue light organic light-emitting diode comprises an anode, a cathode and a blue light-emitting layer between the anode and the cathode; and the quantum dot conversion layer comprises a red quantum dot conversion layer and a green quantum dot conversion layer, wherein the red quantum dot conversion layer comprises a red quantum dot film and a residual green quantum dot film, and the green quantum dot conversion layer comprises a green quantum dot film and a residual red quantum dot film.

10. A display apparatus, comprising the quantum dot photoelectric device of claim 7.

11. The display apparatus of claim 10, wherein the quantum dot photoelectric device comprises quantum dot light-emitting diodes emitting red light, green light and blue light, respectively, and each of the quantum dot light-emitting diodes comprises an anode, a cathode, a quantum dot light-emitting layer between the anode and the cathode, and the quantum dot light-emitting layer is the quantum dot film; wherein, a quantum dot light-emitting layer of the quantum dot light-emitting diode emitting red light comprises a target red quantum dot film, a residual green quantum dot film and a residual blue quantum dot film in a direction away from a substrate sequentially; a ligand for a target red quantum dot of the target red quantum dot film is the oil-soluble ligand, a ligand for a residual green quantum dot of the residual green quantum dot film of the quantum dot light-emitting diode emitting red light is a first ligand, and a ligand for a residual blue quantum dot of the residual blue quantum dot film of the quantum dot light-emitting diode emitting red light is a second ligand;

a quantum dot light-emitting layer of the quantum dot light-emitting diode emitting green light comprises a residual red quantum dot film, a target green quantum dot film and a residual blue quantum dot film in the direction away from the substrate sequentially; a ligand for a target green quantum dot of the target green quantum dot film is the oil-soluble ligand, a ligand for a residual red quantum dot of the residual red quantum dot film of the quantum dot light-emitting diode emitting green light is a third ligand, and a ligand for a residual blue quantum dot of the residual blue quantum dot film of the quantum dot light-emitting diode emitting green light is the second ligand;

a quantum dot light-emitting layer of the quantum dot light-emitting diode emitting blue light comprises a residual red quantum dot film, a residual green quantum dot film and a target blue quantum dot film in the direction away from the substrate sequentially; a ligand for a target blue quantum dot of the target blue quantum dot film is the oil-soluble ligand, a ligand for the-a residual red quantum dot of the residual red quantum dot film of the quantum dot light-emitting diode emitting blue light is the third ligand, and a ligand for a residual green quantum dot of the residual green quantum dot film of the quantum dot light-emitting diode emitting blue light is the first ligand;

wherein each of the first ligand, the second ligand, and the third ligand is independently selected from any one or more of halogen ions and short-chain organic ligands whose carbon chain length is in a range of 2 to 18 carbons.

12. The display apparatus of claim 11, wherein the first ligand is selected from any one or more of I—, Br— and Cl—, or from any one or more of carboxylic acid, sulfonic acid, mercaptan, phosphonic acid and amine;

the second ligand is selected from any one or more of I—, Br— and Cl—, or from any one or more of carboxylic acid, sulfonic acid, mercaptan, phosphonic acid and amine; and the third ligand is selected from any one or more of I—, Br— and Cl—, or from any one or more of carboxylic acid, sulfonic acid, mercaptan, phosphonic acid and amine.

13. The display apparatus of claim 12, wherein the third ligand for the residual red quantum dot comprises a first halogen ion, a second halogen ion and a third halogen ion, wherein the first halogen ion has a particle size greater than that of the second halogen ion, and the second halogen ion has a particle size greater than that of the third halogen ion.

14. The display apparatus of claim 13, wherein the first halogen ion is I—, the second halogen ion is Br—, and the third halogen ion is Cl—.

15. A method for patterning a quantum dot film, comprising steps S100 and S200, wherein:

in S100, quantum dots with oil-soluble ligands are used to form a quantum dot film in a whole pixel region, the quantum dot film in a non-retaining pixel region is removed to obtain a patterned quantum dot film; wherein the patterned quantum dot film comprises a target color quantum dot film and a residual non-target color quantum dot film;

in S200, precursors for exchange ligands are used to perform a ligand exchange reaction with residual quantum dots in the non-retaining pixel region, so that the oil-soluble ligands on surfaces of the residual quantum dots in the non-retaining pixel region are exchanged for the exchange ligands, and a residual quantum dot film in the non-retaining pixel region is obtained;

wherein an exchange ligand of the exchange ligands is selected from any one or more of halogen ions and short-chain organic ligands whose carbon chain length is in a range of 2 to 18carbons;

a residual non-target color quantum dot of the residual non-target color quantum dot film is different in color from a target color quantum dot of the target color quantum dot film;

the residual non-target color quantum dot film does not emit light.

16. The method for patterning the quantum dot film of claim 15, comprising steps S101 S102, S103, S201, S202 and S203:

in S101, red quantum dots with the oil-soluble ligands are used to form a red quantum dot film in the whole pixel region, the red quantum dot film in a green pixel region and a blue pixel region is removed to obtain a patterned red quantum dot film;

in S201, precursors for third exchange ligands are used to perform a ligand exchange reaction with residual red quantum dots in the green pixel region and the blue pixel region, so that the oil-soluble ligands on surfaces of the residual red quantum dots in the green pixel region and the blue pixel region are exchanged for the third exchange ligands, and a residual red quantum dot film in the green pixel region and the blue pixel region is obtained;

in S102, green quantum dots with the oil-soluble ligands are used to form a green quantum dot film in the whole pixel region, the green quantum dot film in a red pixel region and the blue pixel region is removed to obtain a patterned green quantum dot film;

in S202, precursors for first exchange ligands are used to perform a ligand exchange reaction with residual green quantum dots in the red pixel region and the blue pixel region, so that the oil-soluble ligands on surfaces of the residual green quantum dots in the red pixel region and the blue pixel region are exchanged for the first exchange ligands, and a residual green quantum dot film in the red pixel region and the blue pixel region is obtained;

in S103, blue quantum dots with the oil-soluble ligands are used to form a blue quantum dot film in the whole pixel region, the blue quantum dot film in the red pixel region and the green pixel region is removed to obtain a patterned blue quantum dot film;

in S203, precursors for second exchange ligands are used to perform a ligand exchange reaction with residual blue quantum dots in the red pixel region and the green pixel region, so that the oil-soluble ligands on surfaces of the residual blue quantum dots in the red pixel region and the green pixel region are exchanged for the second exchange ligands, and a residual blue quantum dot film in the red pixel region and the green pixel region is obtained.

17. The method for patterning the quantum dot film of claim 15, wherein S200 comprises using precursors for a variety of exchange ligands to sequentially perform a ligand exchange reaction with the residual quantum dots in the non-retaining pixel region, so that the oil-soluble ligands on the surfaces of the residual quantum dots in the non-retaining pixel region are exchanged for the variety of exchange ligands, and the residual quantum dot film in the non-retaining pixel region is obtained.

18. The method for patterning the quantum dot film of claim 17, wherein S200 comprises:

using an organic salt of a first halogen to perform a ligand exchange reaction with the residual quantum dots in the non-retaining pixel region, so that a first residual quantum dot film with a surface ligand comprising a first halogen ion is obtained in the non-retaining pixel region;

using an organic salt of a second halogen in follow to perform a ligand exchange reaction with the residual quantum dots in the non-retaining pixel region, so that a second residual quantum dot film with a surface ligand comprising the first halogen ion and a second halogen ion is obtained in the non-retaining pixel region; and using an organic salt of a third halogen in follow to perform a ligand exchange reaction with the residual quantum dots in the non-retaining pixel region, so that a third residual quantum dot film with a surface ligand comprising the first halogen ion, the second halogen ion and a third halogen ion is obtained in the non-retaining pixel region;

wherein a particle size of the first halogen ion is larger than a particle size of the second halogen ion, and the particle size of the second halogen ion is larger than a particle size of the third halogen ion.

19. The method for patterning the quantum dot film of claim 18, wherein the first halogen ion is I—, the second halogen ion is Br—, and the third halogen ion is Cl—.

20. The method for patterning the quantum dot film of claim 15, wherein the ligand exchange reaction in S200 comprises:

dissolving the precursors for the exchange ligands in a solvent to manufacture a solution containing the precursors for the exchange ligands;

dropping the solution containing the precursors for the exchange ligands on the residual quantum dot film in the non-retaining pixel region, standing the residual quantum dot film in the non-retaining pixel region for a first time period, and then spinning dry; or, soaking the residual quantum dot film in the non-retaining pixel region in the solution containing the precursors for the exchange ligands, taking the residual quantum dot film in the non-retaining pixel region out after standing the residual quantum dot film in the non-retaining pixel region for a second time period, and spinning dry; and cleaning a surface of a spun-dried quantum film in the non-retaining pixel region with a solvent same as that of the solution containing the precursors for the exchange ligands.

* * * * *